(12) United States Patent
Nakao et al.

(10) Patent No.: US 8,110,504 B2
(45) Date of Patent: Feb. 7, 2012

(54) METHOD OF MANUFACTURING SEMICONDUCTOR DEVICE

(75) Inventors: Yuichi Nakao, Kyoto (JP); Satoshi Kageyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 94 days.

(21) Appl. No.: 12/536,472

(22) Filed: Aug. 5, 2009

(65) Prior Publication Data

US 2011/0045669 A1 Feb. 24, 2011

(30) Foreign Application Priority Data

Aug. 5, 2008 (JP) ................. 2008-202138
Aug. 22, 2008 (JP) ................. 2008-214626
Sep. 16, 2008 (JP) ................. 2008-236649
Sep. 25, 2008 (JP) ................. 2008-245864

(51) Int. Cl.
*H01L 21/44* (2006.01)
(52) U.S. Cl. ......... 438/688; 438/660; 438/661; 438/675
(58) Field of Classification Search .................. 438/688, 438/660, 661, 675
See application file for complete search history.

(56) References Cited

U.S. PATENT DOCUMENTS

| 2005/0218519 A1* | 10/2005 | Koike et al. .................. 257/756 |
| 2008/0054467 A1* | 3/2008 | Ohba et al. .................... 257/751 |
| 2009/0117731 A1* | 5/2009 | Yu et al. ........................ 438/627 |
| 2010/0099254 A1* | 4/2010 | Narushima et al. ........... 438/668 |

FOREIGN PATENT DOCUMENTS

JP  2005-277390 A  10/2005

\* cited by examiner

*Primary Examiner* — Michael Lebentritt
*Assistant Examiner* — Karen Kusumakar
(74) *Attorney, Agent, or Firm* — Rabin & Berdo, P.C.

(57) ABSTRACT

The method of manufacturing a semiconductor device according to the present invention includes: an insulating layer forming step of forming an insulating layer made of an insulating material containing Si and O; a groove forming step of forming a groove in the insulating layer; a metal film applying step of covering the inner surface of the groove with a metal film made of $MnO_x$ (x: a number greater than zero) by sputtering; and a wire forming step of forming a Cu wire made of a metallic material mainly composed of Cu on the metal film.

11 Claims, 24 Drawing Sheets

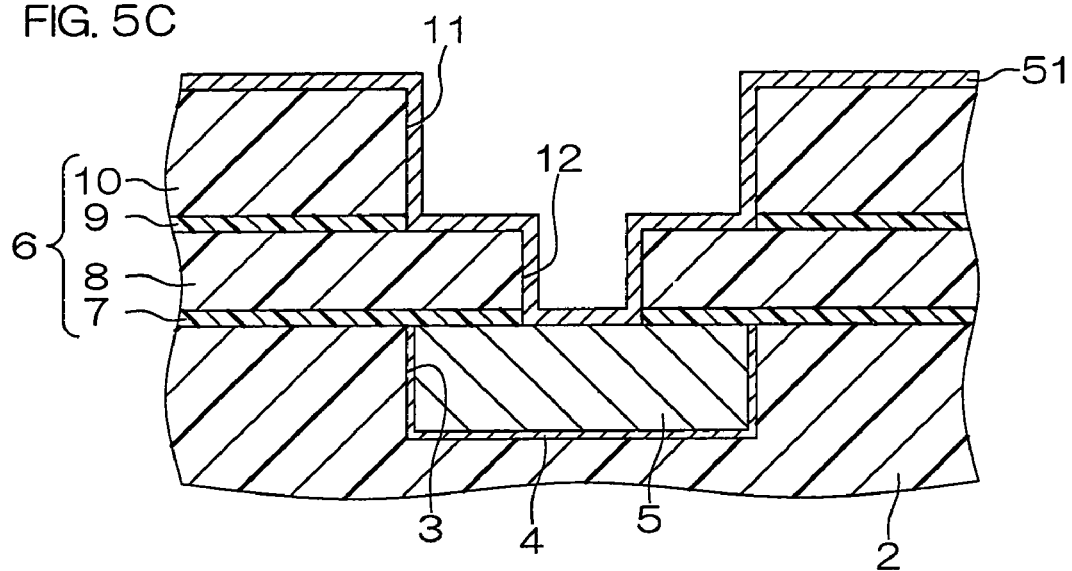
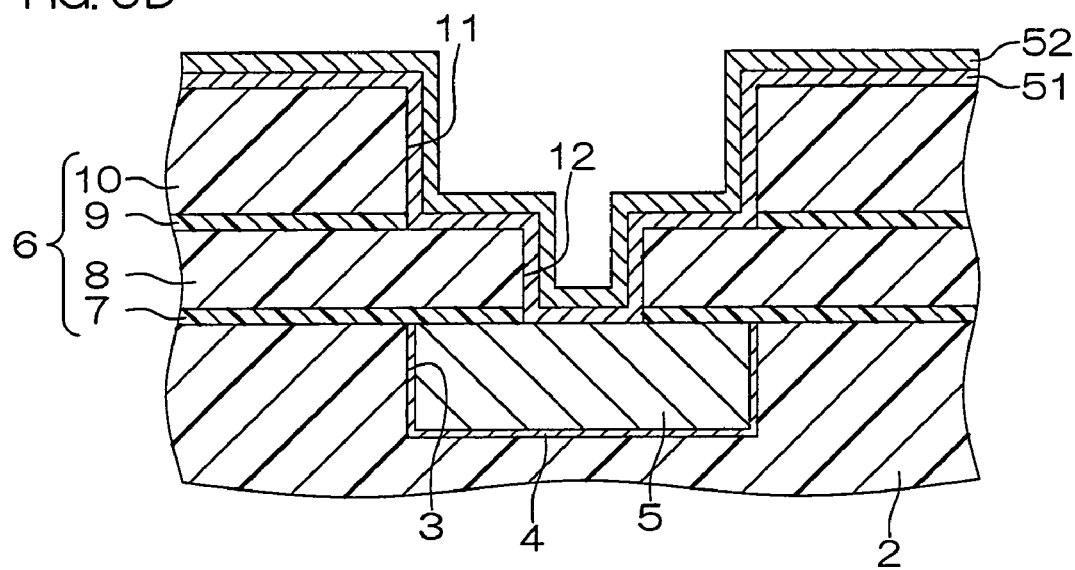

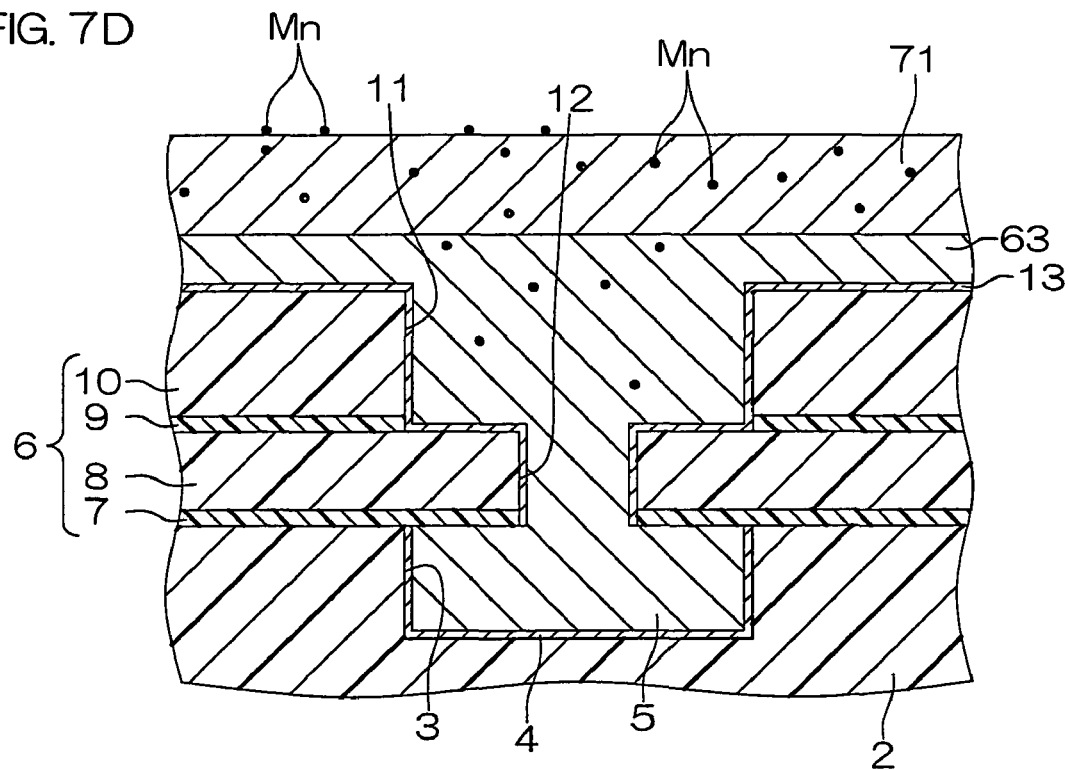

METHOD OF MANUFACTURING SEMICONDUCTOR DEVICE

BACKGROUND OF THE INVENTION

1. Field of the Invention

The present invention relates to a method of manufacturing a semiconductor device having a Cu wire made of a metallic material mainly composed of Cu (copper).

2. Description of Related Art

In a highly integrated semiconductor device, Cu having higher conductivity than Al (aluminum) maybe employed as the material for a wire. A wire (a Cu wire) employing Cu as the material therefor is embedded in a fine groove formed in an insulating layer on a semiconductor substrate by a damascene process, since it is difficult to finely pattern Cu by dry etching.

In general, $SiO_2$ (silicon oxide) is employed as the material for the insulating layer. However, Cu has high diffusibility into $SiO_2$. When the inner surface of the groove formed in the insulating layer made of $SiO_2$ and the Cu wire are directly in contact with each other, therefore, Cu diffuses into the insulating layer, to reduce the dielectric voltage of the insulating layer. Therefore, a barrier film for preventing Cu from diffusing into the insulating layer must be provided between the insulating layer and the Cu wire.

A self-formation process employing an alloy material (hereinafter simply referred to as a "CuMn alloy") containing Cu and Mn (manganese) is known as a technique of forming the barrier film. In the self-formation process, an alloy film made of the CuMn alloy is formed on the surface of the insulating layer including the inner surface of the groove by sputtering. Then, a Cu layer made of a metallic material mainly composed of Cu is stacked on the alloy film by plating. Thereafter heat treatment is performed, whereby Mn contained in the alloy film is bonded to Si (silicon) and O (oxygen) contained in the insulating layer, and a barrier film made of $Mn_xSi_yO_z$ (x, y and z: numbers greater than zero. $Mn_xSi_yO_z$ is hereinafter simply referred to as "MnSiO") is formed on the inner surface of the groove.

After the formation of the barrier film, the surface of the Cu layer is polished by CMP (Chemical Mechanical Polishing) until the same is flush with the surface of the insulating layer out of the groove. Thus, a Cu wire embedded in the groove through the barrier film is obtained.

Excess Mn not contributing to the formation of the barrier film (bonding to Si and O) diffuses into the Cu layer. If the quantity of Mn diffusing into the Cu layer is large, Mn remains in the Cu wire, to increase the resistance of the Cu wire. While the specific resistance of pure Cu is about 1.9 to 2.0 $\mu\Omega\cdot cm$, the specific resistance of Cu containing Mn by 1% (at. %) in atomicity is about 5 to 6 $\mu\Omega\cdot cm$. In a fine Cu wire having a width of 60 to 70 nm, slight increase in specific resistance leads to remarkable increase in wire resistance.

In order to reduce the quantity of Mn remaining in the Cu wire, the alloy film made of the CuMn alloy may be set to the minimum thickness necessary for forming the barrier film.

When the alloy film is formed by sputtering, however, the CuMn alloy is harder to bond to the side surfaces of the groove as compared with the bottom surface thereof. If the alloy film is formed to have the minimum thickness necessary for forming the barrier film on the bottom surface of the groove, therefore, portions of the alloy film formed on the side surfaces of the groove are excessively reduced in thickness. Adhesiveness of the CuMn alloy to $SiO_2$ is not high, and hence the adhesiveness between the alloy film and the side surfaces of the groove may be reduced to result in separation of the alloy film from the side surfaces of the groove if the alloy film is excessively reduced in thickness on the side surfaces of the groove. When the alloy film separates from the side surfaces of the groove, the barrier film made of MnSiO cannot be excellently formed on the separating portions.

Therefore, the alloy film is formed with a thickness larger than the minimum thickness necessary for forming the barrier film, in order to ensure the adhesiveness of the alloy film to the inner surface of the groove and prevent separation of the alloy film from the side surfaces of the groove. The adhesiveness of the CuMn alloy to $SiO_2$ is reduced as the Mn concentration therein is decreased, and hence a CuMn alloy having a relatively high Mn concentration is employed as the material for the alloy film. Therefore, the alloy film excessively contains Mn.

SUMMARY OF THE INVENTION

An object of the present invention is to provide a method of manufacturing a semiconductor device capable of reducing the quantity of Mn remaining in a Cu wire.

A method of manufacturing a semiconductor device according to a first aspect of the present invention includes: an insulating layer forming step of forming an insulating layer made of an insulating material containing Si and O; a groove forming step of forming a groove in the insulating layer; a metal film applying step of covering the inner surface of the groove with a metal film made of $MnO_x$ (x: a number greater than zero) by sputtering; and a wire forming step of forming a Cu wire made of a metallic material mainly composed of Cu on the metal film.

According to the method, the groove is first formed in the insulating layer made of the insulating material containing Si and O. Then, the inner surface of the groove (the side surface and the bottom surface of the groove when the groove is concavely formed) is covered with the metal film made of $MnO_x$ (x: a number greater than zero, $MnO_x$ is hereinafter simply referred to as "MnO") by sputtering. At this time, MnO in the metal film is introduced into the inner surface of the groove, i.e., a portion of the insulating layer facing the groove, due to the energy of the sputtering. Thus, Si and O in the insulating layer and MnO in the metal film are bonded to one another, and a barrier film made of MnSiO is formed on the inner surface of the groove. Thereafter the Cu wire made of the metallic material mainly composed of Cu is formed on the metal film (the barrier film).

MnO has higher adhesiveness to the insulating material containing Si and O as compared with the CuMn alloy. Therefore, the metal film made of MnO hardly separates from the side surface of the groove, also when the same is formed with a small thickness (the minimum thickness necessary for forming the barrier film) necessary and sufficient for forming the barrier film with a desired thickness. Therefore, the barrier film can be excellently formed on the inner surface of the groove. When the inner surface of the groove is covered with the metal film, the barrier film made of MnSiO can be formed due to the energy of the sputtering, whereby no heat treatment may be performed for forming the barrier film.

The metal film is formed with such a small thickness, whereby the quantity of excess Mn not contributing to the formation of the barrier film can be reduced. Thus, the quantity of Mn remaining in the Cu wire formed on the barrier film can be reduced.

Therefore, the quantity of Mn remaining in the Cu wire can be reduced while the barrier film can be excellently formed on the inner surface of the groove.

A lower wire electrically connected with the Cu wire may be formed under the insulating layer. In this case, the lower wire and the Cu wire can be electrically connected with each other by carrying out a via hole forming step of forming a via hole extending from the groove toward the lower wire and passing through the insulating layer in the thickness direction after the groove forming step and before the metal film applying step and carrying out a via forming step of forming a via made of a metallic material mainly composed of Cu in the via hole after the metal film applying step. In the metal film applying step, the barrier film made of MnSiO can be formed on the side surface of the via hole by covering the side surface of the via hole and a portion of the surface of the lower wire facing the via hole with the metal film in addition to the inner surface of the groove.

MnO employed as the material for the metal film has higher electrical resistance as compared with Cu. When the metal film made of MnO is present on the portion of the surface of the lower wire facing the via hole, therefore, the electrical resistance between the via and the lower wire is increased.

Therefore, a step of removing O from a portion of the metal film in contact with the surface of the lower wire by hydrogen reduction is preferably carried out in advance of the via forming step. When O is removed, MnO is reduced to Mn. Mn diffuses into the via and the like, whereby the metal film disappears from the lower wire.

In place of the step, a step of selectively removing a portion of the metal film in contact with the surface of the lower wire by reverse sputtering may be carried out in advance of the via forming step. The reverse sputtering can be performed in a sputtering apparatus identical to that employed for the sputtering. When the reverse sputtering is employed in the step of removing the portion of the metal film in contact with the surface of the lower wire, therefore, the step of partially removing the metal film can be carried out continuously to the metal film applying step in the same sputtering apparatus. When the Cu wire is formed by plating, a seed film is formed on the metal film by sputtering. In the case, the step of forming the seed film can be continuously carried out in the same sputtering apparatus, in addition to the metal film applying step and the step of partially removing the metal film. Therefore, the structure of an apparatus for manufacturing the semiconductor device can be simplified and a semiconductor wafer (a semiconductor substrate in a wafer state provided with the insulating layer) may not be transported between the steps, whereby the time necessary for manufacturing the semiconductor device can be reduced.

The wire forming step may include the steps of forming a seed film made of a metallic material mainly composed of Cu on the metal film by sputtering, and forming a plating layer made of Cu on the seed film by plating.

However, the plating layer has a heterogeneous crystal structure and high specific resistance in the state grown by plating. If the Cu wire and the via are formed by plating, therefore, the wire forming step preferably includes a crystallizing step of crystallizing the plating layer by heat treatment. Thus, the crystal structure of the plating layer is homogenized (crystallized), whereby the specific resistance of the Cu wire and the via consisting of the plating layer can be reduced.

A method of manufacturing a semiconductor device according to a second aspect of the present invention includes: a groove forming step of forming a groove in an insulating layer made of an insulating material containing Si and O; a metal film applying step of covering the inner surface of the groove with a metal film made of Mn; a barrier film forming step of forming a barrier film made of MnSiO on the inner surface of the groove by heat treatment after the metal film applying step; and a wire forming step of forming a Cu wire made of a metallic material mainly composed of Cu on the barrier film.

According to the method, the groove is first formed in the insulating layer made of the insulating material containing Si and O. Then, the inner surface of the groove (the side surface and the bottom surface of the groove when the groove is concavely formed) is covered with the metal film made of Mn. Then, the heat treatment for bonding Mn in the metal film and Si and O in the insulating layer to one another is performed. As a result of the heat treatment, the barrier film made of MnSiO is formed on the inner surface of the groove. Thereafter the Cu wire made of the metallic material mainly composed of Cu is formed on the barrier film.

Mn has higher adhesiveness to the insulating material containing Si and O as compared with the CuMn alloy. Therefore, the metal film made of Mn hardly separates from the side surface of the groove also when the same is formed with a small thickness (the minimum thickness necessary for forming the barrier film) necessary and sufficient for forming the barrier film with a desired thickness. Therefore, the barrier film can be excellently formed on the inner surface of the groove.

The metal film is formed with such a small thickness, whereby the quantity of excess Mn not contributing to the formation of the barrier film can be reduced. Thus, the quantity of Mn remaining in the Cu wire formed on the barrier film can be reduced.

Therefore, the quantity of Mn remaining in the Cu wire can be reduced while the barrier film can be excellently formed on the inner surface of the groove.

The barrier film made of MnSiO may be formed by a method of covering the inner surface of the groove with an alloy film made of a CuMn alloy and bonding Mn in the alloy film and Si and O in the insulating layer to one another by heat treatment thereby forming the barrier film on the inner surface of the groove. Alternatively, the barrier film may be formed by a method of covering the inner surface of the groove with a metal film made of Mn, forming a thin film (a seed film employed for growing Cu by plating, for example) made of Cu on the metal film and thereafter forming the barrier film on the inner surface of the groove by heat treatment.

According to either method, however, Cu spherically aggregates on the barrier film in the heat treatment. If spherically aggregating on the barrier film, Cu cannot be excellently grown on the barrier film by plating when the Cu wire is formed by plating.

In the method according to the second aspect, on the other hand, Cu is not present on and in the metal film made of Mn in the formation of the barrier film, whereby no Cu spherically aggregates on the barrier film. Therefore, Cu can be excellently grown on the barrier film by plating.

The wire forming step may include the steps of forming a seed film made of a metallic material mainly composed of Cu on the metal film by sputtering, and forming a plating layer made of Cu on the seed film by plating. No spherically aggregating Cu is present on the barrier film, and hence the seed film can be excellently formed on the barrier film, and the plating layer can be excellently formed on the seed film.

However, the plating layer has a heterogeneous crystal structure and high specific resistance in the state grown by plating. If the Cu wire is formed by plating, therefore, the wire forming step preferably includes a crystallizing step of crystallizing the plating layer by heat treatment. Thus, the crystal structure of the plating layer is homogenized (crystallized), whereby the specific resistance of the Cu wire consisting of the plating layer can be reduced.

A method of manufacturing a semiconductor device according to a third aspect of the present invention includes the steps of: forming a groove in an insulating layer made of an insulating material containing Si and O; covering the inner surface of the groove with an alloy film made of a CuMn alloy; stacking a Cu layer made of a metallic material mainly composed of Cu on the alloy film to fill up the groove; forming a barrier film made of MnSiO between the Cu layer and the insulating layer by heat treatment; stacking a sacrificial layer made of an insulating material containing Si and O on the Cu layer for forming a reaction product film made of MnSiO on the Cu layer after the formation of the barrier film; and removing the sacrificial layer and the reaction product film from the Cu layer.

According to the method, the groove is first formed in the insulating layer made of the insulating material containing Si and O. Then, the inner surface (the side surface and the bottom surface) of the groove is covered with the alloy film made of the CuMn alloy. Thereafter the Cu layer made of the metallic material mainly composed of Cu is formed on the alloy film to fill up the groove. After the formation of the Cu layer, the barrier film made of MnSiO is formed between the Cu layer and the insulating layer by heat treatment. After the formation of the barrier film, the sacrificial layer made of the insulating material containing Si and O is stacked on the Cu layer.

The sacrificial layer contains Si and O, whereby Si and O contained in the sacrificial layer and Mn contained in the Cu layer are bonded to one another on the interface between the Cu layer and the sacrificial layer when heat is applied to the Cu layer and the sacrificial layer, to form the reaction product film made of MnSiO. After the formation of the reaction product film, the sacrificial layer and the reaction product film are removed from the Cu layer. After the removal of the sacrificial layer and the reaction product film, a Cu wire embedded in the groove through the barrier film is obtained by removing the Cu layer from a portion located outside the groove so that the surface of the Cu layer is flush with the surface of a portion of the insulating layer located outside the groove, for example.

Mn is used for forming the reaction product film, whereby the quantity of Mn contained in the Cu layer is reduced. Thus, the quantity of Mn remaining in the Cu wire consisting of the Cu layer can be reduced.

The sacrificial layer and the reaction product film are preferably removed by CMP. When CMP is employed for removing the sacrificial layer and the reaction product film, the sacrificial layer and the reaction product film can be removed through a single step. When the Cu layer is worked into the Cu wire by CMP continuously to the removal of the sacrificial layer and the reaction product film by CMP, a slurry for removing a Ta (tantalum) film is employed, whereby the sacrificial layer and the reaction product film can be excellently removed, and the Cu layer and the insulating layer can be removed at generally identical polishing rates. Consequently, a Cu wire having a surface excellent in planarity can be obtained.

The sacrificial layer is preferably formed by PECVD (Plasma Enhanced Chemical Vapor Deposition). In this case, a high temperature (about 400° C.) is applied to the Cu layer and the sacrificial layer stacked thereon in the process of stacking the sacrificial layer on the Cu layer, whereby no heat treatment (heat treatment after the stacking of the sacrificial layer) is required for forming the reaction product film on the interface between the Cu layer and the sacrificial layer. Consequently, the steps of manufacturing the semiconductor device can be simplified.

The sacrificial layer is particularly preferably formed by PECVD employing gas containing $SiH_4$ (silane). The sacrificial layer can be formed also by PECVD (TEOS-CVD) employing TEOS (Tetraethoxysilane). In the PECVD employing TEOS, however, $O_2$ gas is employed and the Cu layer etc. are exposed to an $O_2$ gas atmosphere of a high temperature (about 400° C.), and hence Cu contained in the Cu layer is easily oxidized. In the PECVD employing the gas containing $SiH_4$, on the other hand, not the $O_2$ gas but $N_2O$ gas is employed, whereby Cu is harder to oxidize as compared with the PECVD employing TEOS.

After the formation of the barrier film, the steps of forming the reaction product film (stacking the sacrificial layer) and removing the sacrificial layer and the reaction product film may be carried out in this order a plurality of times. When the steps are repeated a plurality of times, the quantity of Mn contained in the Cu layer is reduced as the steps are repeated. Therefore, the quantity of Mn remaining in the Cu wire can be reliably reduced.

A step of polishing the surface of the Cu layer by CMP is preferably further carried out after the formation of the barrier film and before the stacking of the sacrificial layer. In the formation of the barrier film, Mn contained in the alloy film partially moves in the Cu layer, to appear on the surface of the Cu layer. When the surface of the Cu layer is polished by CMP to remove Mn appearing on the surface of the Cu layer and the sacrificial layer is thereafter stacked on the Cu layer, Mn remaining in the Cu layer is positively used for the reaction with Si and O. Consequently, the quantity of Mn contained in the Cu layer can be efficiently reduced, and the quantity of Mn remaining in the Cu wire can be further reduced.

A method of manufacturing a semiconductor device according to a fourth aspect of the present invention includes the steps of: forming a groove in an insulating layer made of an insulating material containing Si and O; covering the inner surface of the groove with an alloy film made of an alloy material containing Cu and Mn; stacking a Cu layer made of a metallic material mainly composed of Cu on the alloy film to fill up the groove; stacking a sacrificial layer made of high-purity Cu on the Cu layer; forming a barrier film made of MnSiO between the Cu layer and the insulating layer by heat treatment after the stacking of the sacrificial layer; and removing the sacrificial layer from the Cu layer after the formation of the barrier film.

According to the method, the groove is first formed in the insulating layer made of the insulating material containing Si and O. Then, the inner surface (the side surface and the bottom surface) of the groove is covered with the alloy film made of the CuMn alloy. Thereafter the Cu layer made of the metallic material mainly composed of Cu is formed on the alloy film to fill up the groove. After the formation of the Cu layer, the sacrificial layer made of high-purity Cu is stacked on the Cu layer. After the formation of the sacrificial layer, the barrier film made of MnSiO is formed between the insulating layer and the Cu layer by heat treatment. After the heat treatment, the sacrificial layer is removed from the Cu layer. After the removal of the sacrificial layer, a Cu wire embedded in the groove through the barrier film is obtained by removing the Cu layer from a portion located outside the groove so that the surface of the Cu layer is flush with the surface of a portion of the insulating layer located outside the groove, for example.

In the heat treatment, excess Mn not contributing to the formation of the barrier film diffuses into the Cu layer. The sacrificial layer made of high-purity Cu is stacked on the Cu layer, whereby Mn diffusing into the Cu layer partially moves in the Cu layer to be attracted to the sacrificial layer, and diffuses into the sacrificial layer. The quantity of Mn contained in the Cu layer is reduced due to the diffusion of Mn into the sacrificial layer. Therefore, the quantity of Mn remaining in the Cu wire consisting of the Cu layer can be reduced.

The term "high-purity Cu" denotes Cu having purity of not less than 99.995%.

A method of manufacturing a semiconductor device according to a fifth aspect of the present invention includes the steps of: forming a groove in an insulating layer made of an insulating material containing Si and O; covering the inner surface of the groove with an alloy film made of an alloy material containing Cu and Mn; stacking a Cu layer made of a metallic material mainly composed of Cu on the alloy film to fill up the groove; performing heat treatment after the stacking of the Cu layer; removing a surface layer portion of the Cu layer after the heat treatment; stacking a sacrificial layer made of a metallic material mainly composed of Cu on the Cu layer after the removal of the surface layer portion of the Cu layer; reperforming heat treatment after the stacking of the sacrificial layer; and removing the sacrificial layer from the Cu layer after the reperformance of the heat treatment.

According to the method, the groove is first formed in the insulating layer made of the insulating material containing Si and O. Then, the inner surface (the side surface and the bottom surface) of the groove is covered with the alloy film made of the CuMn alloy. Thereafter the Cu layer made of the metallic material mainly composed of Cu is formed on the alloy film to fill up the groove. After the stacking of the Cu layer, the heat treatment is performed. The barrier film made of MnSiO is formed between the insulating layer and the Cu layer by the heat treatment. After the heat treatment, the surface layer portion of the Cu layer is removed. Thereafter the sacrificial layer made of the metallic material mainly composed of Cu is formed on the Cu layer, and the heat treatment is reperformed. After the sacrificial layer is removed from the Cu layer, a Cu wire embedded in the groove through the barrier film is obtained by removing the Cu layer from a portion located outside the groove so that the surface of the Cu layer is flush with the surface of a portion of the insulating layer located outside the groove, for example.

Excess Mn not contributing to the formation of the barrier film diffuses into the Cu layer due to the heat treatment after the stacking of the Cu layer. Mn diffusing into the Cu layer partially appears on the surface of the Cu layer. The surface layer portion of the Cu layer is removed after the heat treatment, whereby Mn reaching the surface layer portion of the Cu layer and that appearing on the surface of the Cu layer are removed along with the surface layer portion of the Cu layer. When the sacrificial layer is stacked after the surface layer portion of the Cu layer is removed and the heat treatment is reperformed, Mn remaining in the Cu layer diffuses into the sacrificial layer. The quantity of Mn contained in the Cu layer is reduced due to the diffusion of Mn into the sacrificial layer. Therefore, the quantity of Mn remaining in the Cu wire consisting of the Cu layer can be reduced.

In the method according to the fifth aspect, the sacrificial layer is preferably made of high-purity Cu. When the sacrificial layer is made of high-purity Cu, Mn remaining in the Cu layer can excellently diffuse into the sacrificial layer. Consequently, the quantity of Mn contained in the Cu layer can be effectively reduced, and the quantity of Mn remaining in the Cu wire can be further reduced.

After the removal of the surface layer portion of the Cu layer, the steps of stacking the sacrificial layer, reperforming the heat treatment and removing the sacrificial layer may be repeated in this order a plurality of times. When the steps are repeated a plurality of times, the quantity of Mn contained in the Cu layer is reduced as the steps are repeated. Therefore, the quantity of Mn remaining in the Cu wire can be reliably reduced.

The foregoing and other objects, features and effects of the present invention will become more apparent from the following detailed description of the embodiments with reference to the attached drawings.

BRIEF DESCRIPTION OF THE DRAWINGS

FIGS. 7A to 7G are schematic sectional views showing the steps of manufacturing a semiconductor device by a method according to a sixth embodiment of the present invention.

DETAILED DESCRIPTION OF PREFERRED EMBODIMENTS

Figure 1:
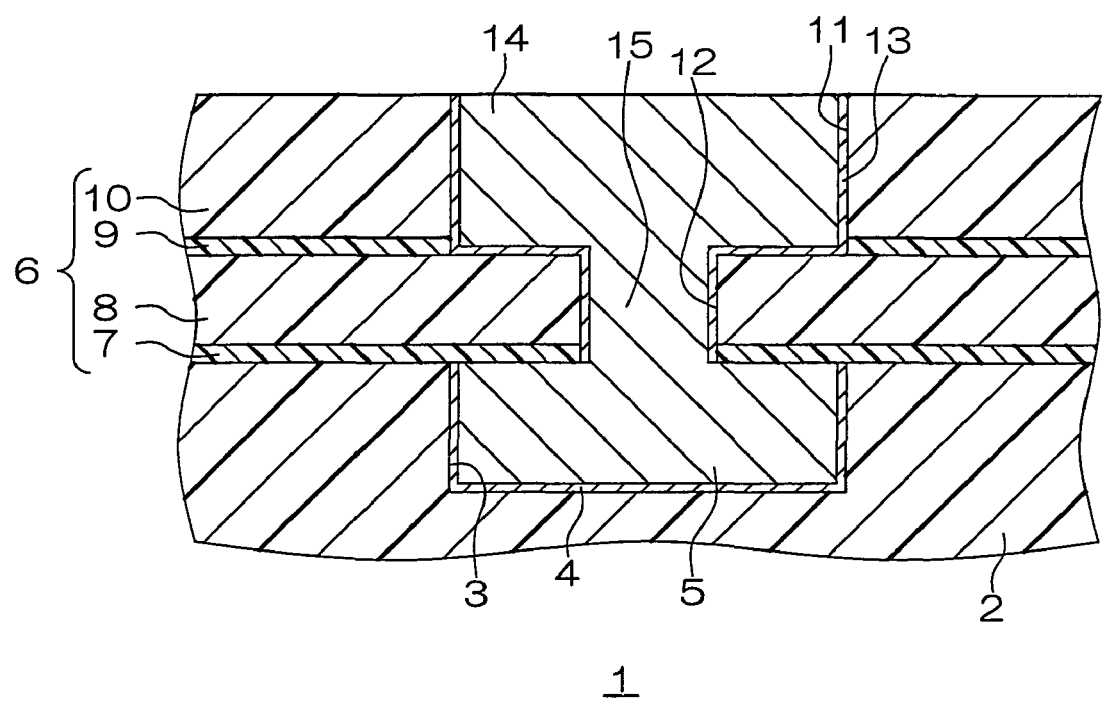
FIG. 1 is a schematic sectional view showing the structure of a semiconductor device manufactured by a method according to the present invention.

FIG. 1 is a schematic sectional view of a semiconductor device manufactured by a method according to an embodiment of the present invention.

A semiconductor device 1 includes a semiconductor substrate (not shown). Elements such as MOSFETs (Metal Oxide Semiconductor Field-Effect Transistors) are provided on the semiconductor substrate. A first insulating layer 2 made of $SiO_2$ is laminated on the semiconductor substrate.

A first groove 3 is formed in a surface layer portion of the first insulating layer 2 in a prescribed pattern. The first groove 3 is in the form of a recess dug from the upper surface of the first insulating layer 2. A first barrier film 4 made of MnSiO is formed on the inner surfaces (the side surfaces and the bottom surface) of the first groove 3. A first Cu wire 5 made of a metallic material mainly composed of Cu is embedded in the first groove 3 through the first barrier film 4.

A second insulating layer 6 is stacked on the first insulating layer 2. The second insulating layer 6 has a structure obtained by stacking a diffusion preventing film 7, an interlayer dielectric film 8, an etching stopper film 9 and an insulating film 10 in this order from the side of the first insulating layer 2.

The diffusion preventing film 7 is made of SiC (silicon carbide) and/or SiCN (silicon carbonitride), for example.

The interlayer dielectric film 8 and the insulating film 10 are made of $SiO_2$ which is an insulating material containing Si and O, for example.

The etching stopper film 9 is made of SiC, for example.

A second groove 11 is formed in a surface layer portion of the second insulating layer 6. The second groove 11 is in the form of a recess dug from the upper surface of the insulating film 10 up to the upper surface of the interlayer dielectric film 8. The side surfaces of the second groove 11 are formed by the insulating film 10 and the etching stopper film 9, while the bottom surface of the second groove 11 is formed by the upper surface of the interlayer dielectric film 8.

The second groove 11 is formed in a pattern having a portion intersecting with the first Cu wire 5 (the first groove 3) in plan view. In the portion where the first Cu wire 5 and the second groove 11 intersect with each other in plan view, a via hole 12 passing through the diffusion preventing film 7 and the interlayer dielectric film 8 is formed between the first Cu wire 5 and the second groove 11.

A second barrier film 13 made of MnSiO is formed on the inner surfaces of the second groove 11 and the via hole 12 (the side surfaces and the bottom surface of the second groove 11 and the side surfaces of the via hole 12). A second Cu wire 14 and a via 15 made of a metallic material mainly composed of Cu are embedded in the second groove 11 and the via hole 12 respectively through the second barrier film 13. The second Cu wire 14 and the via 15 are integrated with each other.

FIGS. 2A to 2G are schematic sectional views showing the steps of manufacturing the semiconductor device by a method according to a first embodiment of the present invention.

Figure 2A:
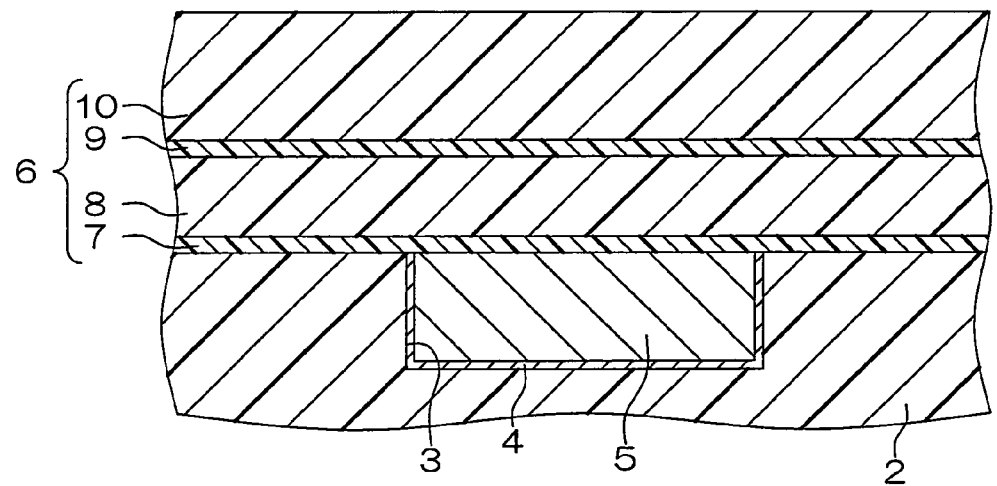
FIGS. 2A to 2G are schematic sectional views showing the steps of manufacturing a semiconductor device by a method according to a first embodiment of the present invention.

As shown in FIG. 2A, the diffusion preventing film 7, the interlayer dielectric film 8, the etching stopper film 9 and the insulating film 10 are stacked in this order by CVD (Chemical Vapor Deposition) on the first insulating layer 2 having the first barrier film 4 and the first Cu wire 5 embedded therein. Thus, the second insulating layer 6 is formed on the first insulating layer 2.

Figure 2B:
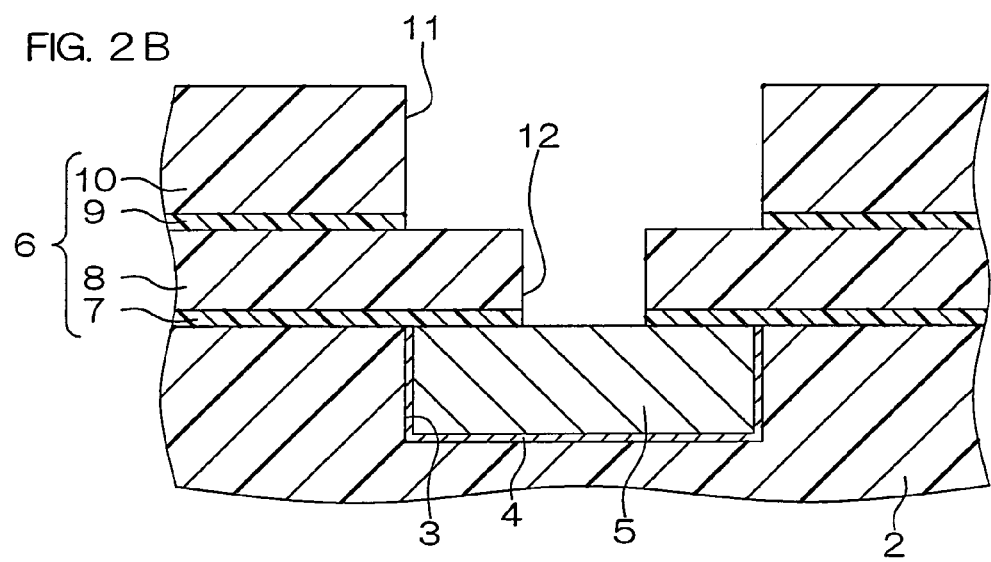

Thereafter the second groove 11 and the via hole 12 are formed in the second insulating layer 6, as shown in FIG. 2B. More specifically, a mask (not shown) having an opening selectively exposing a portion to be provided with the via hole 12 is first formed on the second insulating layer 6. Then, the insulating film 10, the etching stopper film 9 and the interlayer dielectric film 8 are dry-etched through the mask. At this time, the insulating film 10, the etching stopper film 9 and the interlayer dielectric film 8 are continuously etched by switching reaction gas (etchant) at proper timing. Then, the mask is removed from the second insulating layer 6, and another mask (not shown) having an opening selectively exposing a portion to be provided with the second groove 11 is formed on the second insulating layer 6. Then, the insulating film 10 is dry-etched through the mask. Thereafter the second groove 11 and the via hole 12 are formed by removing exposed portions of the diffusion preventing film 7 and the etching stopper film 9.

Figure 2C:
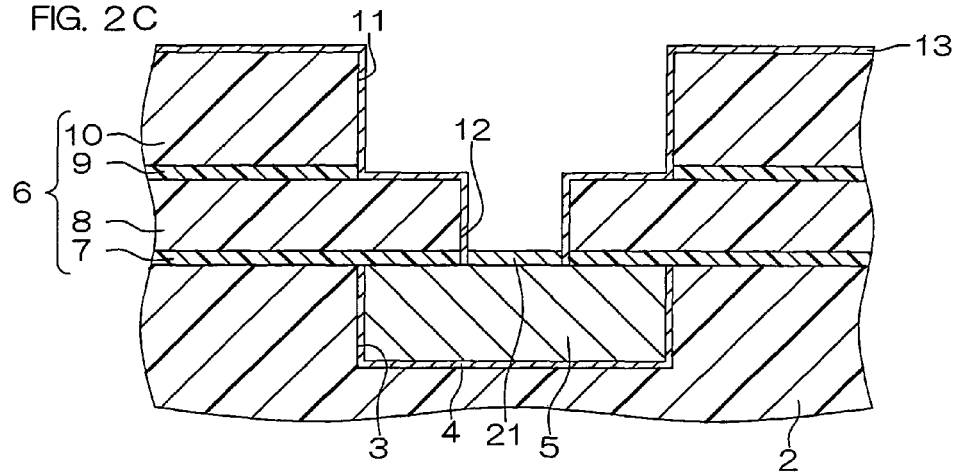

Then, the overall surface of the second insulating layer 6 including the inner surfaces of the second groove 11 and the via hole 12 and a portion of the surface of the first Cu wire 5 facing the via hole 12 are covered with a metal film 21 made of MnO by sputtering, as shown in FIG. 2C. The metal film 21 is formed with a thickness (1 to 10 nm, for example) necessary and sufficient for forming the second barrier film 13. At this time, MnO in the metal film 21 is introduced into a portion of the metal film 21 in contact with the second insulating layer 6 (the overall surface of the second insulating layer 6 including the inner surfaces of the second groove 11 and the via hole 12) due to the energy of the sputtering. Thus, Si and O in the second insulating layer 6 and MnO in the metal film 21 are bonded to one another, whereby the barrier film 13 made of MnSiO is formed on the overall surface of the second insulating layer 6 including the inner surfaces of the second groove 11 and the via hole 12. The portion of the metal film 21 in contact with the second insulating layer 6 disappears following the formation of the second barrier film 13, and the metal film 21 remains only on the first Cu wire 5.

Figure 2D:
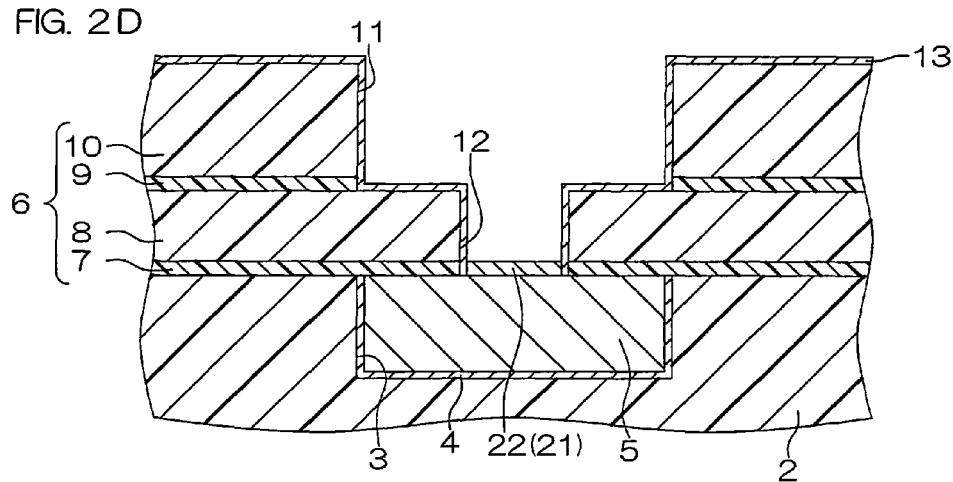

Thereafter hydrogen reduction is performed. The metal film 21 left on the first Cu wire 5 is reduced by the hydrogen reduction, to be altered to an Mn film 22 made of Mn, as shown in FIG. 2D. The hydrogen reduction may be heat treatment in a hydrogen atmosphere or hydrogen plasma treatment, for example.

Figure 2E:
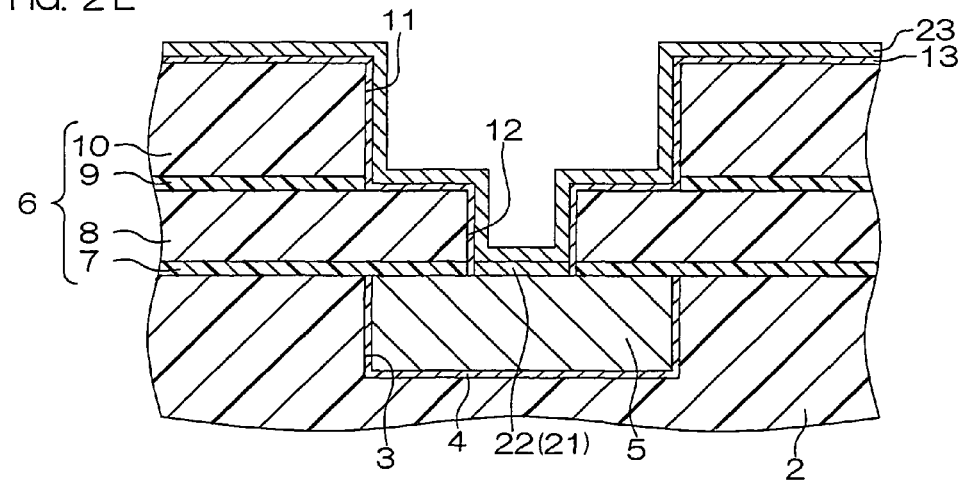

Then, a seed film 23 made of a metallic material mainly composed of Cu is formed by sputtering to cover the overall surface of the second barrier film 13 and the surface of the Mn film 22, as shown in FIG. 2E.

Figure 2F:
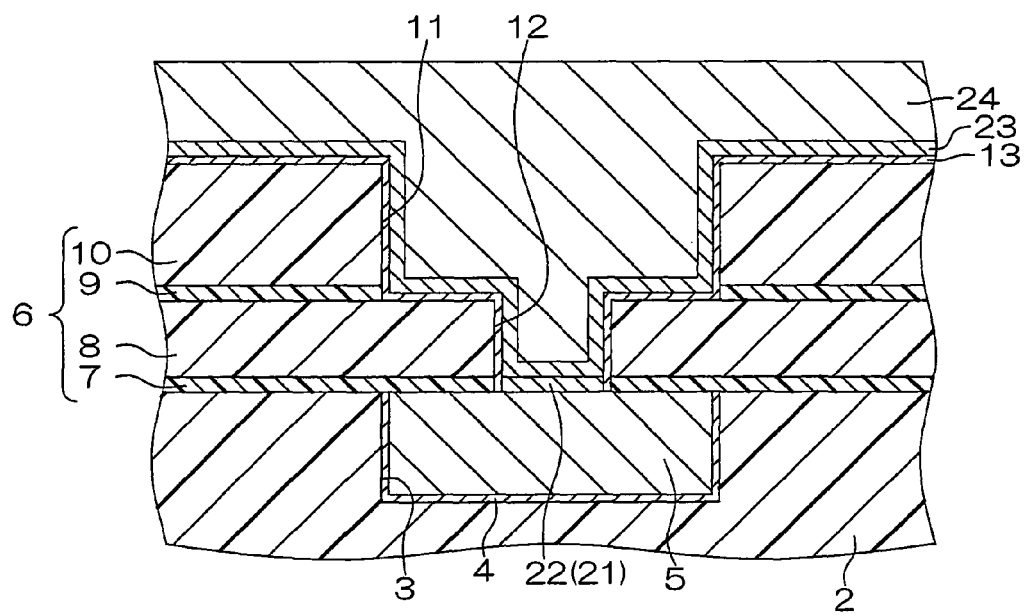

Thereafter a plating layer 24 made of Cu is formed on the seed film 23 by plating, as shown in FIG. 2F. The plating layer 24 is formed with a thickness for filling up the via hole 12 and the second groove 11.

Figure 2G:
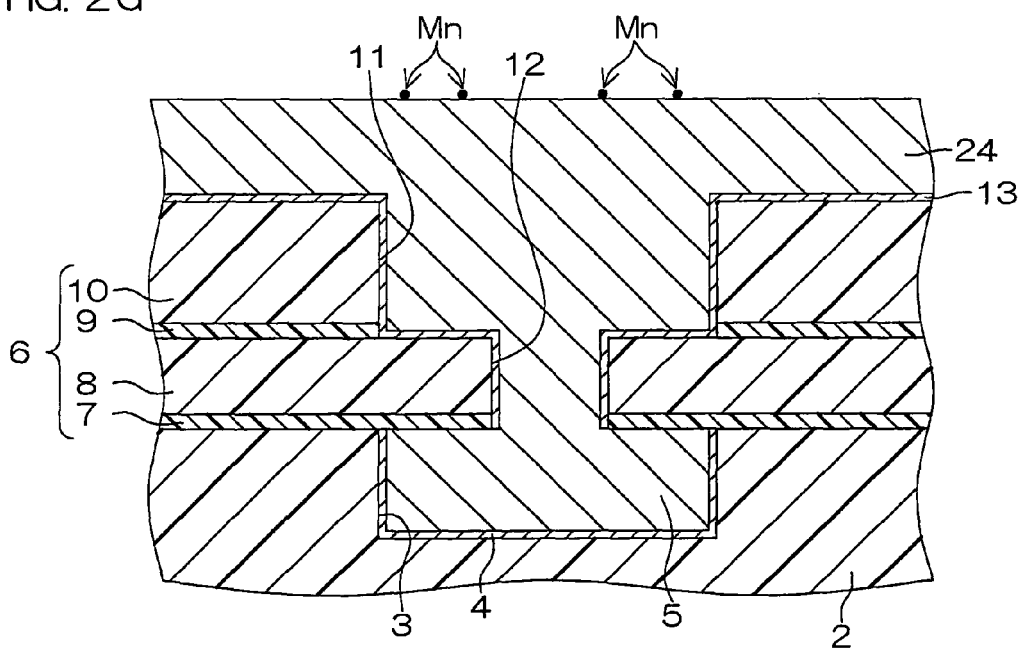

The plating layer 24 has a heterogeneous crystal structure and high specific resistance in the state grown by plating. After the plating growth, therefore, heat treatment is performed for crystallizing (homogenizing the crystal structure of) the plating layer 24. At this time, Mn in the Mn film 22 moves in the plating layer 24 and is deposited on the surface of the plating layer 24, as shown in FIG. 2G. Therefore, the Mn film 22 disappears in the heat treatment for crystallizing the plating layer 24.

Then, the plating layer 21 and the second barrier film 13 are polished by CMP (Chemical Mechanical Polishing). The polishing is continued until unnecessary portions of the plating layer 24 and the second barrier film 13 formed outside the second groove 11 are entirely removed, the second insulating layer 6 (the insulating film 10) is exposed, and the exposed surface of the second insulating layer 6 and the surface of the plating layer 24 in the second groove 11 are flush with each other. Thus, the semiconductor device 1 shown in FIG. 1 is obtained.

The metal film 21 made of MnO has relatively high adhesiveness to the insulating film 10 made of $SiO_2$. Therefore, the metal film 21 hardly separates from the side surfaces of the second groove 11 (from the insulating film 10) also when the same is formed with a small thickness necessary and sufficient for forming the second barrier film 13 with a desired thickness. Therefore, the second barrier film 13 can be excellently formed on the inner surfaces of the second groove 11. When the inner surfaces of the second groove 11 are covered with the metal film 21, the second barrier film 13 can be formed due to the energy of the sputtering, whereby no heat treatment may be performed for forming the second barrier film 13.

O is removed from the portion of the metal film 21 in contact with the surface of the first Cu wire 5 due to the hydrogen reduction, and the portion is reduced to the Mn film 22 made of Mn. The Mn film 22 diffuses into the via 15 and the like, to disappear. Mn has higher electrical resistance than Cu. When the metal film 21 (the Mn film 22) is removed from the first Cu wire 5 in the aforementioned manner, therefore, the electrical resistance between the first Cu wire 5 and the second Cu wire 14 can be reduced as compared with a structure leaving the metal film 21 made of MnO between the first Cu wire 5 and the via 15.

The plating layer 24 formed by plating growth has a heterogeneous crystal structure and high specific resistance in the state grown by plating. The heat treatment for crystallizing the plating layer 24 is performed after the formation of the plating layer 24 for homogenizing (crystallizing) the crystal structure of the plating layer 24, whereby the specific resistance of the second Cu wire 14 and the via 15 consisting of the plating layer 24 can be reduced.

FIGS. 3A to 3G are schematic sectional views showing the steps of manufacturing the semiconductor device by a method according to a second embodiment of the present invention.

Figure 3A:
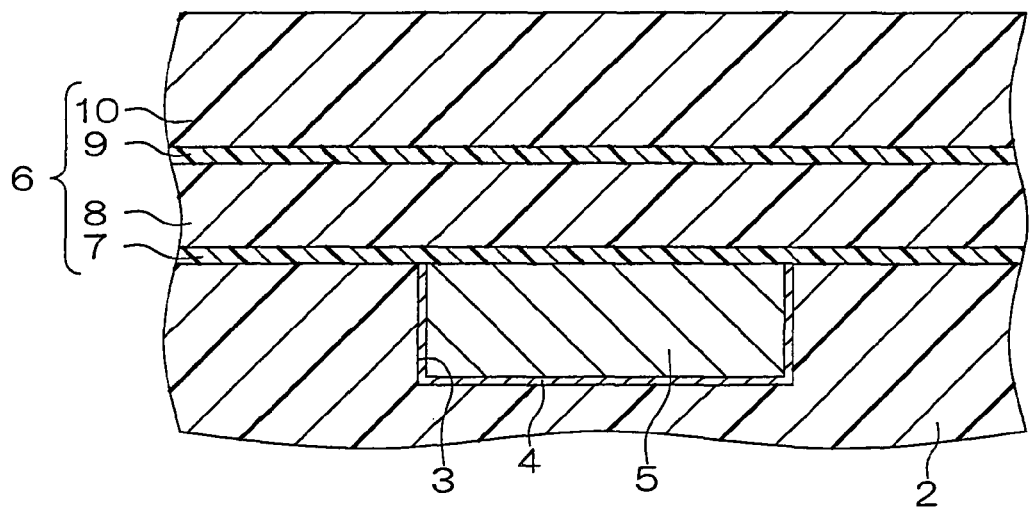
FIGS. 3A to 3G are schematic sectional views showing the steps of manufacturing a semiconductor device by a method according to a second embodiment of the present invention.

As shown in FIG. 3A, the diffusion preventing film 7, the interlayer dielectric film 8, the etching stopper film 9 and the insulating film 10 are stacked in this order by CVD (Chemical Vapor Deposition) on the first insulating layer 2 having the first barrier film 4 and the first Cu wire 5 embedded therein. Thus, the second insulating layer 6 is formed on the first insulating layer 2.

Figure 3B:
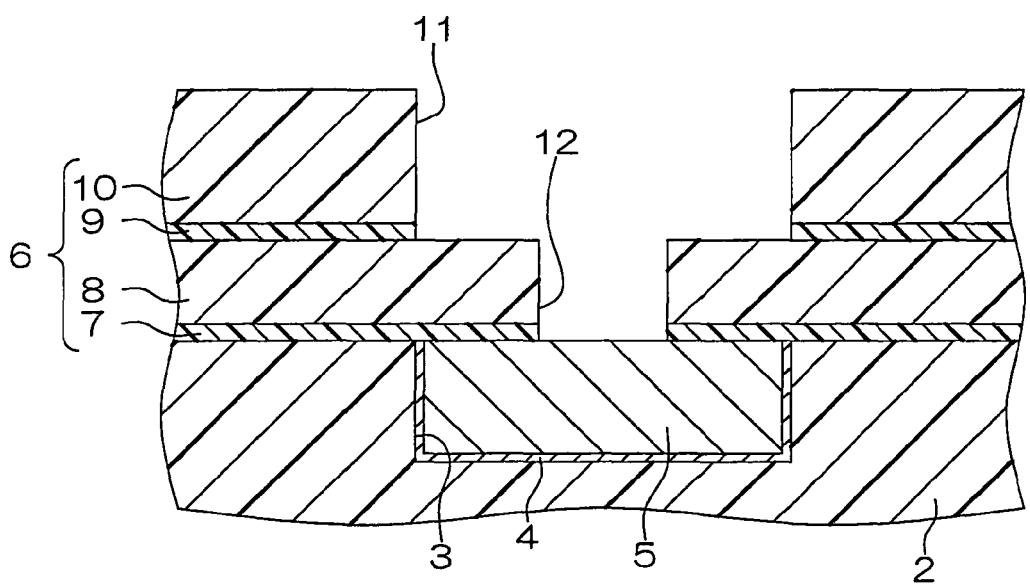

Thereafter the second groove 11 and the via hole 12 are formed in the second insulating layer 6, as shown in FIG. 3B. More specifically, a mask (not shown) having an opening selectively exposing a portion to be provided with the via hole 12 is first formed on the second insulating layer 6. Then, the insulating film 10, the etching stopper film 9 and the interlayer dielectric film 8 are dry-etched through the mask. At this time, the insulating film 10, the etching stopper film 9 and the interlayer dielectric film 8 are continuously etched by switching reaction gas (etchant) at proper timing. Then, the mask is removed from the second insulating layer 6, and another mask (not shown) having an opening selectively exposing a portion to be provided with the second groove 11 is formed on the second insulating layer 6. Then, the insulating film 10 is dry-etched through the mask. Thereafter the second groove 11 and the via hole 12 are formed by removing exposed portions of the diffusion preventing film 7 and the etching stopper film 9.

Figure 3C:
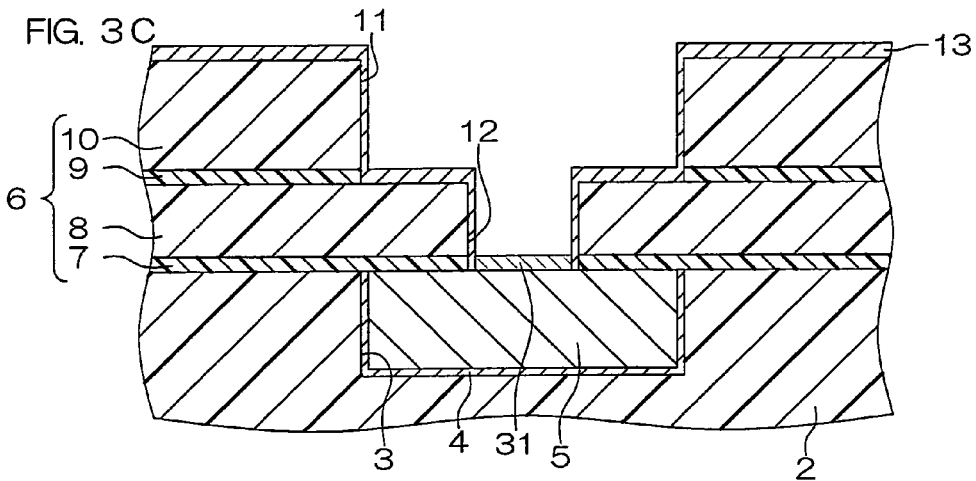

Then, the overall surface of the second insulating layer 6 including the inner surfaces of the second groove 11 and the via hole 12 and a portion of the surface of the first Cu wire 5 facing the via hole 12 are covered with a metal film 31 made of MnO by sputtering, as shown in FIG. 3C. The metal film 31 is formed with a thickness (1 to 10 nm, for example) necessary and sufficient for forming the second barrier film 13. At this time, MnO in the metal film 31 is introduced into a portion of the metal film 31 in contact with the second insulating layer 6 (the overall surface of the second insulating layer 6 including the inner surfaces of the second groove 11 and the via hole 12) due to the energy of the sputtering. Thus, Si and O in the second insulating layer 6 and MnO in the metal film 31 are bonded to one another, whereby the barrier film 13 made of MnSiO is formed on the overall surface of the second insulating layer 6 including the inner surfaces of the second groove 11 and the via hole 12. The portion of the metal film 31 in contact with the second insulating layer 6 disappears following the formation of the second barrier film 13, and the metal film 31 remains only on the first Cu wire 5.

Figure 3D:
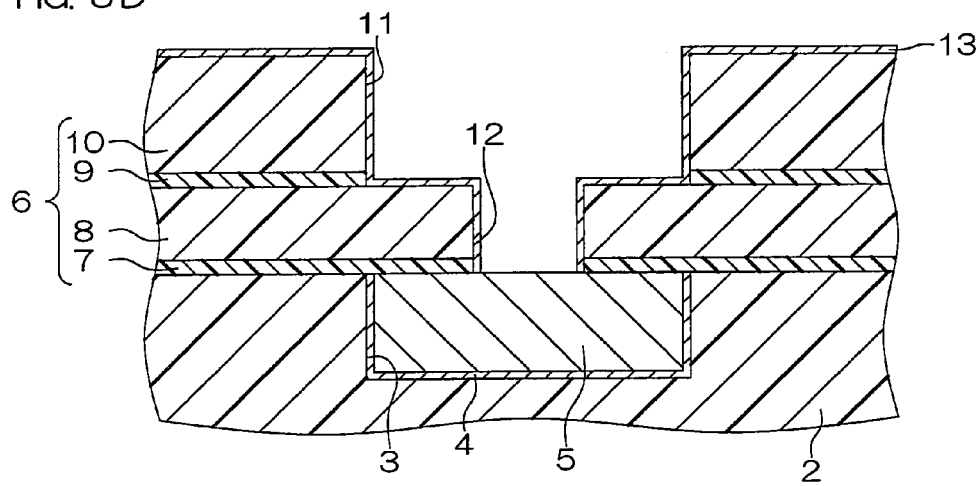

Thereafter the metal film 31 left on the first Cu wire 5 is removed by reverse sputtering, as shown in FIG. 3D. More specifically, gas particles (argon gas particles, for example) are collided with the metal film 31 from a generally vertical direction (a direction along the stacking direction of the second insulating layer 6), thereby removing the portion of the metal film 31 formed on the first Cu wire 5. The second barrier film 13 is strongly bonded to the second insulating layer 6, and hence not removed by the reverse sputtering.

Figure 3E:
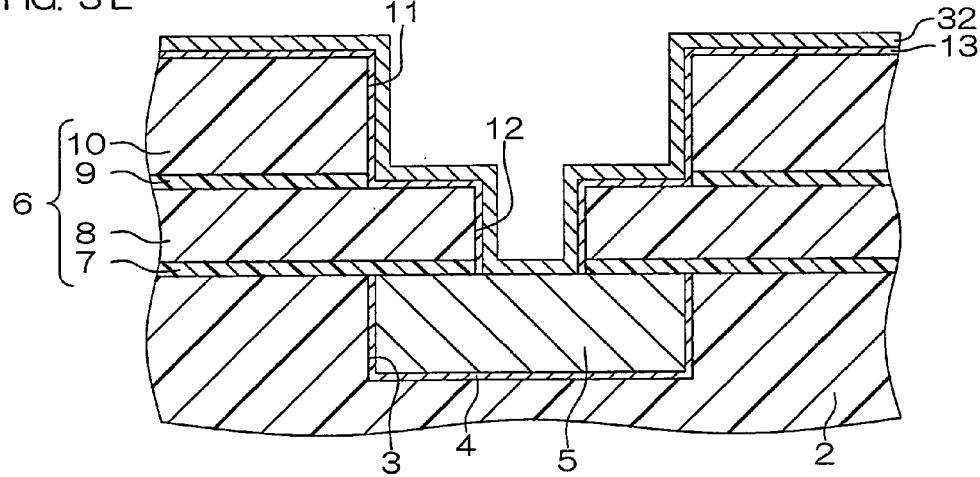

Then, a seed film 32 made of a metallic material mainly composed of Cu is formed by sputtering to cover the overall surface of the second barrier film 13 and a portion of the first Cu wire 5 exposed through the via hole 12, as shown in FIG. 3E.

Figure 3F:
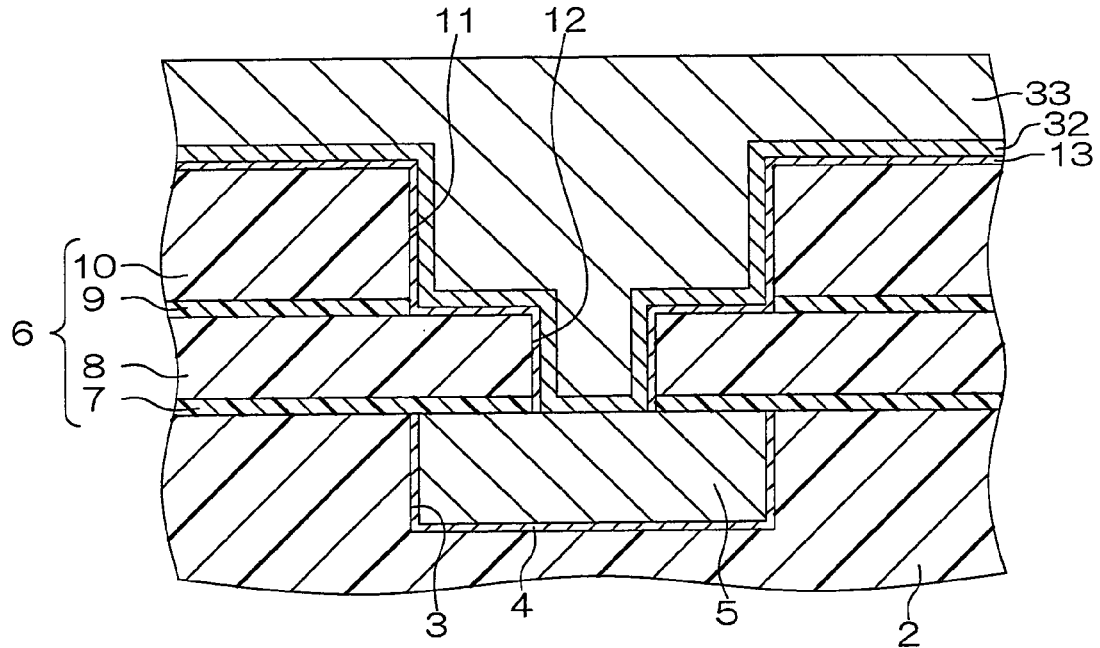
Figure 3G:
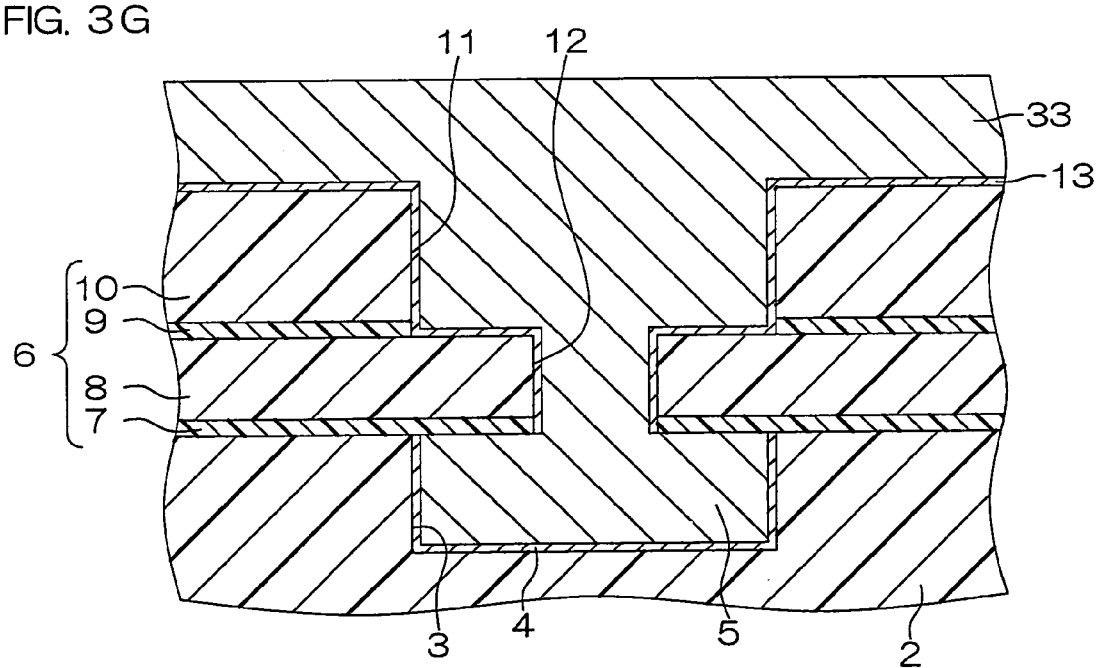

Thereafter a plating layer 33 made of Cu is formed on the seed film 32 by plating, as shown in FIG. 3F. The plating layer 33 is formed with a thickness for filling up the via hole 12 and the second groove 11.

Then, heat treatment is performed for crystallizing (homogenizing the crystal structure of) the plating layer 33.

Then, the plating layer 33 and the second barrier film 13 are polished by CMP. The polishing is continued until unnecessary portions of the plating layer 33 and the second barrier film 13 formed outside the second groove 11 are entirely removed, the second insulating layer 6 (the insulating film 10) is exposed, and the exposed surface of the second insulating layer 6 and the surface of the plating layer 33 in the second groove 11 are flush with each other. Thus, the semiconductor device 1 shown in FIG. 1 is obtained.

Also in the method according to the second embodiment, effects similar to those of the method (FIGS. 2A to 2G) according to the first embodiment can be attained. According to the second embodiment, the metal film 31 left on the first Cu wire 5 is removed by the reverse sputtering after the formation of the second barrier film 13. Thus, the electrical resistance between the first Cu wire 5 and the second Cu wire 14 can be reduced.

The reverse sputtering can be performed in a sputtering apparatus identical to that employed for the sputtering. When the reverse sputtering is employed for removing the portion of the metal film 31 formed on the bottom surface of the via hole 12, therefore, the step of partially removing the metal film 31 can be carried out continuously to the step of forming the metal film 31 in the same sputtering apparatus. Further, the step of forming the seed film 32 can be carried out continuously to the step of removing the metal film 31. Therefore, the structure of an apparatus for manufacturing the semiconductor device 1 can be simplified and a semiconductor wafer (a semiconductor substrate in a wafer state provided with the insulating layers 2 and 6) may not be transported between the steps, whereby the time necessary for manufacturing the semiconductor device 1 can be reduced.

FIGS. 4A to 4G are schematic sectional views showing the steps of manufacturing the semiconductor device by a method according to a third embodiment of the present invention.

Figure 4A:
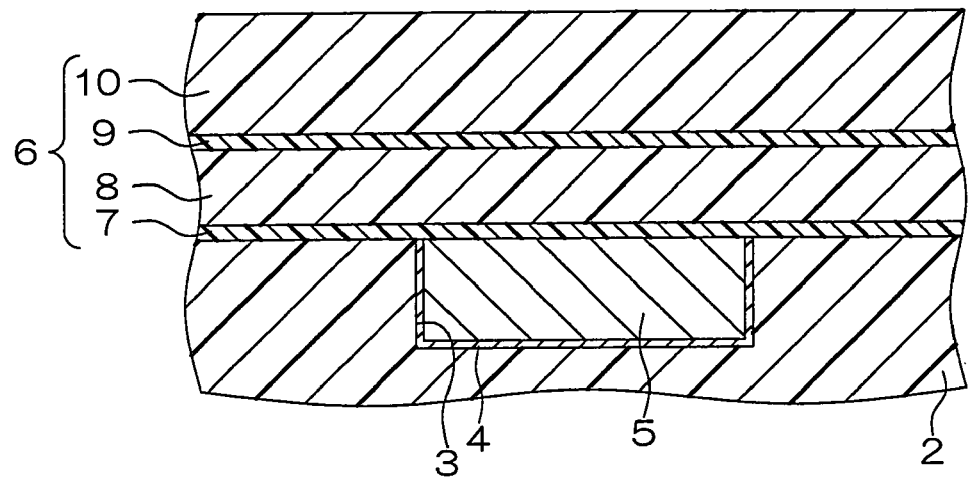
FIGS. 4A to 4G are schematic sectional views showing the steps of manufacturing a semiconductor device by a method according to a third embodiment of the present invention.

As shown in FIG. 4A, the diffusion preventing film 7, the interlayer dielectric film 8, the etching stopper film 9 and the insulating film 10 are stacked in this order by CVD on the first insulating layer 2 having the first barrier film 4 and the first Cu wire 5 embedded therein. Thus, the second insulating layer 6 is formed on the first insulating layer 2.

Figure 4B:
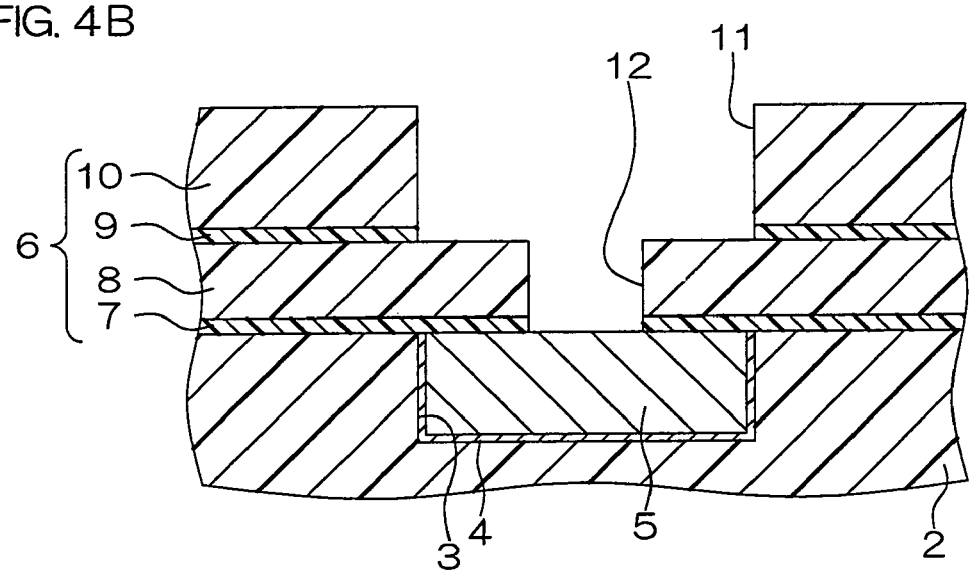

Thereafter the second groove 11 and the via hole 12 are formed in the second insulating layer 6, as shown in FIG. 4B. More specifically, a mask (not shown) having an opening selectively exposing a portion to be provided with the via hole 12 is first formed on the second insulating layer 6. Then, the insulating film 10, the etching stopper film 9 and the interlayer dielectric film 8 are dry-etched through the mask. At this time, the insulating film 10, the etching stopper film 9 and the interlayer dielectric film 8 are continuously etched by switching reaction gas (etchant) at proper timing. Then, the mask is removed from the second insulating layer 6, and another mask (not shown) having an opening selectively exposing a portion to be provided with the second groove 11 is formed on the second insulating layer 6. Then, the insulating film 10 is dry-etched through the mask. Thereafter the second groove 11 and the via hole 12 are formed by removing exposed portions of the diffusion preventing film 7 and the etching stopper film 9.

Figure 4C:
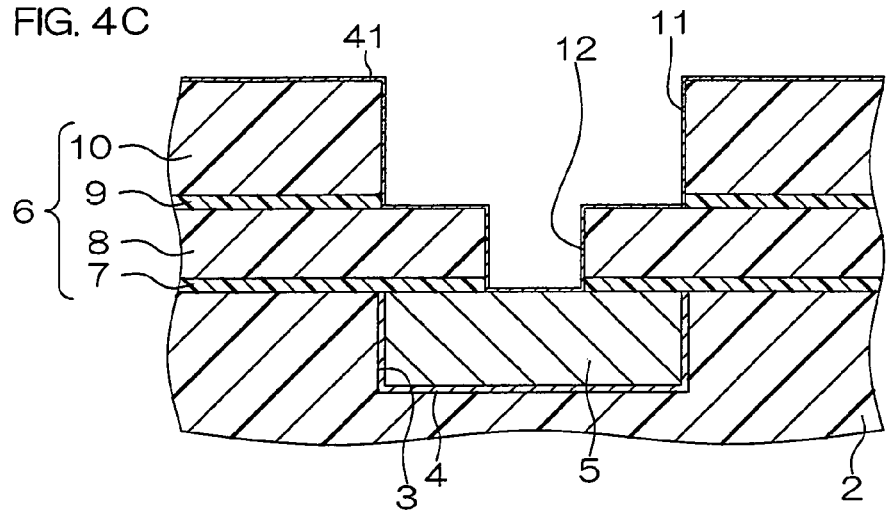

Then, the overall surface of the second insulating layer 6 including the inner surfaces of the second groove 11 and the via hole 12 and a portion of the first Cu wire 5 exposed through the via hole 12 are covered with a metal film 41 made of Mn by sputtering, as shown in FIG. 4C. The metal film 41 is formed with a thickness (1 to 10 nm, for example) necessary and sufficient for forming the second barrier film 13 (see FIG. 1) having a desired thickness.

Figure 4D:
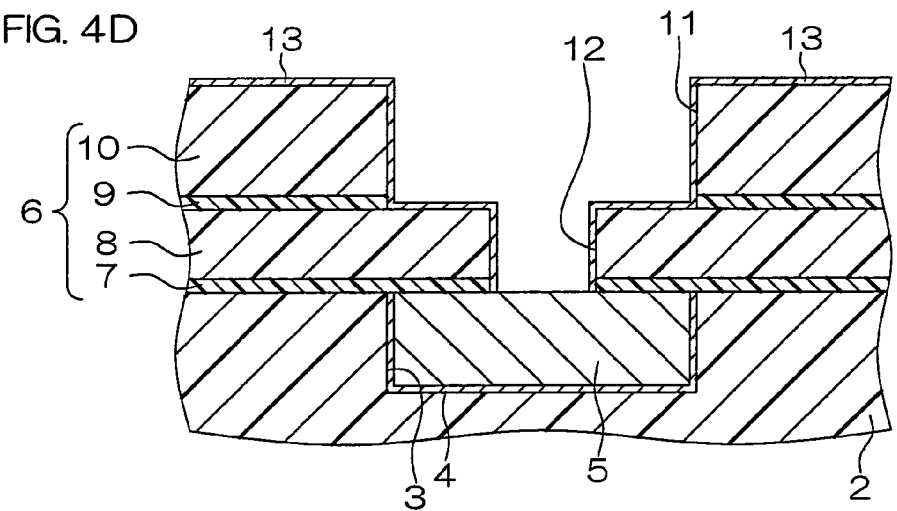

Thereafter heat treatment is performed for forming the second barrier film 13. The heat treatment is performed at a temperature of 250 to 350° C. for 20 to 60 minutes, for example. Mn in the metal film 41 is bonded to Si and O in the second insulating layer 6 on the interface between the metal film 41 and the second insulating layer 6, due to the heat treatment. Consequently, the second barrier film 13 made of MnSiO is formed on the inner surfaces of the second groove 11 and the via hole 12, as shown in FIG. 4D. The metal film 41 disappears following the formation of the second barrier film 13.

Figure 4E:
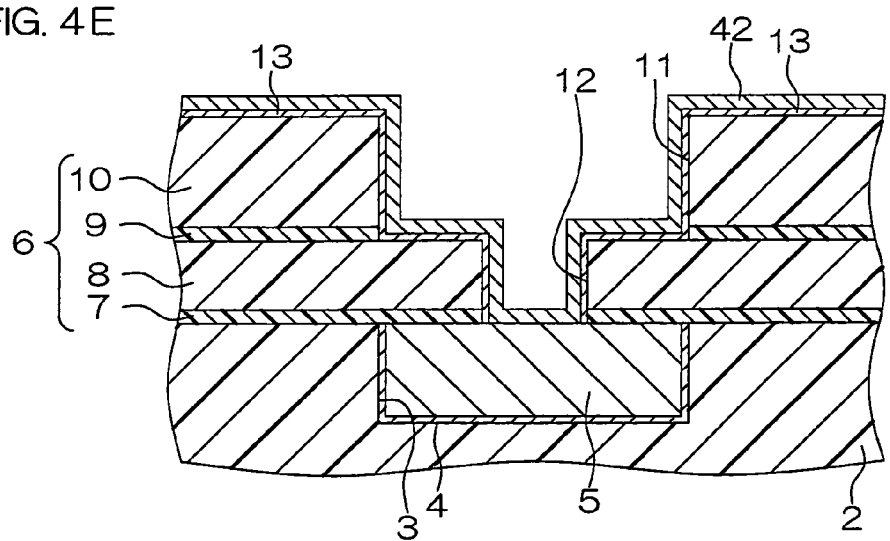

Then, a seed film 42 made of a metallic material mainly composed of Cu is formed by sputtering to cover the overall surface of the second barrier film 13 and the portion of the first Cu wire 5 exposed through the via hole 12, as shown in FIG. 4E. The seed film 42 is formed with a thickness of 40 to 100 nm, for example.

Figure 4F:
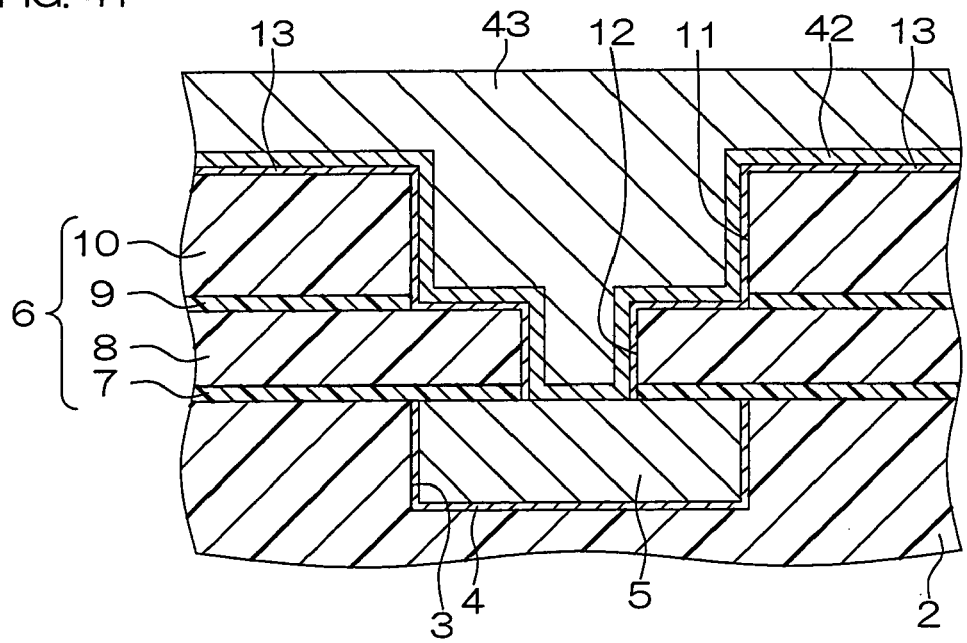
Figure 4G:
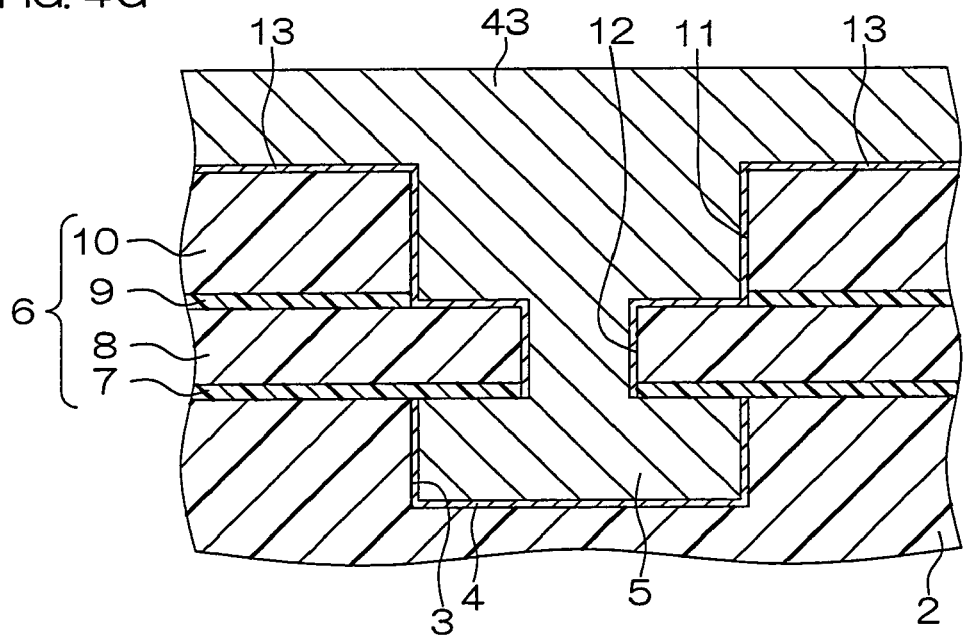

Thereafter a plating layer 43 made of Cu is formed on the seed film 42 by plating, as shown in FIG. 4F. The plating layer 43 is formed with a thickness for filling up the via hole 12 and the second groove 11.

The plating layer 43 has a heterogeneous crystal structure and high specific resistance in the state grown by plating. After the plating growth, therefore, heat treatment is performed for crystallizing (homogenizing the crystal structure of) the plating layer 43.

Then, the plating layer 43 and the second barrier film 13 are polished by CMP. The polishing is continued until unnecessary portions of the plating layer 43 and the second barrier film 13 formed outside the second groove 11 are entirely removed, the second insulating layer 6 (the insulating film 10) is exposed, and the exposed surface of the second insulating layer 6 and the surface of the plating layer 43 in the second groove 11 are flush with each other. Thus, the semiconductor device 1 shown in FIG. 1 is obtained.

The metal film 41 made of Mn has relatively high adhesiveness to the insulating film 10 made of $SiO_2$. Therefore, the metal film 41 hardly separates from the side surfaces of the second groove 11 (from the insulating film 10) also when the same is formed with a small thickness necessary and sufficient for forming the second barrier film 13 with a desired thickness. Therefore, the second barrier film 13 can be excellently formed on the inner surfaces of the second groove 11.

The metal film 41 is formed with a small thickness necessary and sufficient for forming the second barrier film 13 having the desired thickness, whereby the quantity of excess Mn not contributing to the formation of the second barrier film 13 can be reduced. Consequently, the quantities of Mn remaining in the second Cu wire 14 and the via 15 embedded in the second groove 11 and the via hole 12 respectively through the second barrier film 13 can be reduced.

Thus, the quantities of Mn remaining in the second Cu wire 14 and the via 15 can be reduced while the second barrier film 13 can be excellently formed on the inner surfaces of the second groove 11.

Further, Cu is not present on and in the metal film 41 in the formation of the second barrier film 13, whereby no Cu spherically aggregates on the second barrier film 13. Therefore, Cu can be excellently grown on the second barrier film 13 by plating.

However, the plating layer 43 formed by the plating growth has a heterogeneous crystal structure and high specific resistance in the state grown by plating. When the heat treatment for crystallizing the plating layer 43 is performed after the formation of the plating layer 43, the crystal structure of the plating layer 43 can be homogenized, and the specific resistance of the plating layer 43 (the second Cu wire 14) can be reduced.

FIGS. 5A to 5J are schematic sectional views showing the steps of manufacturing the semiconductor device by a method according to a fourth embodiment of the present invention.

Figure 5A:
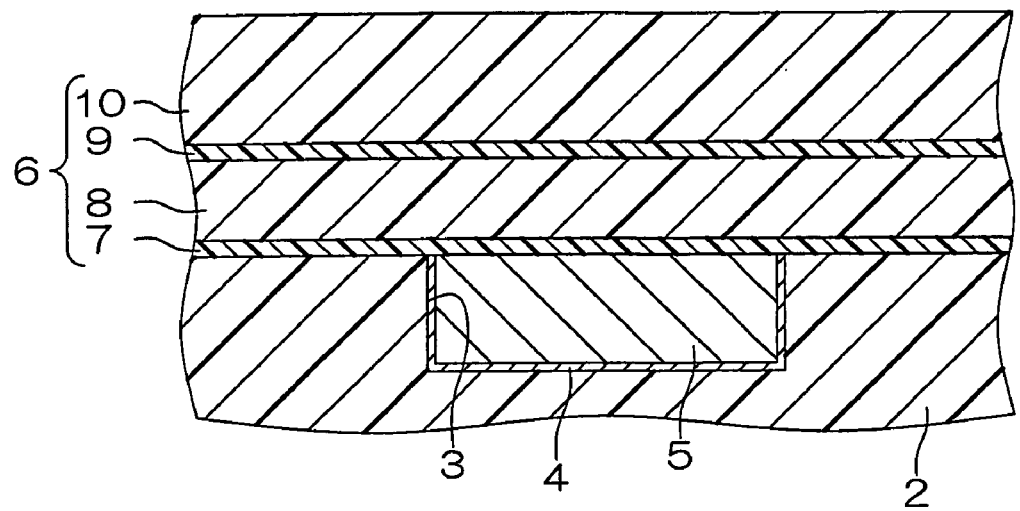
FIGS. 5A to 5J are schematic sectional views showing the steps of manufacturing a semiconductor device by a method according to a fourth embodiment of the present invention.

As shown in FIG. 5A, the diffusion preventing film 7, the interlayer dielectric film 8, the etching stopper film 9 and the insulating film 10 are stacked in this order by CVD on the first insulating layer 2 having the first barrier film 4 and the first Cu wire 5 embedded therein. Thus, the second insulating layer 6 is formed on the first insulating layer 2.

Figure 5B:
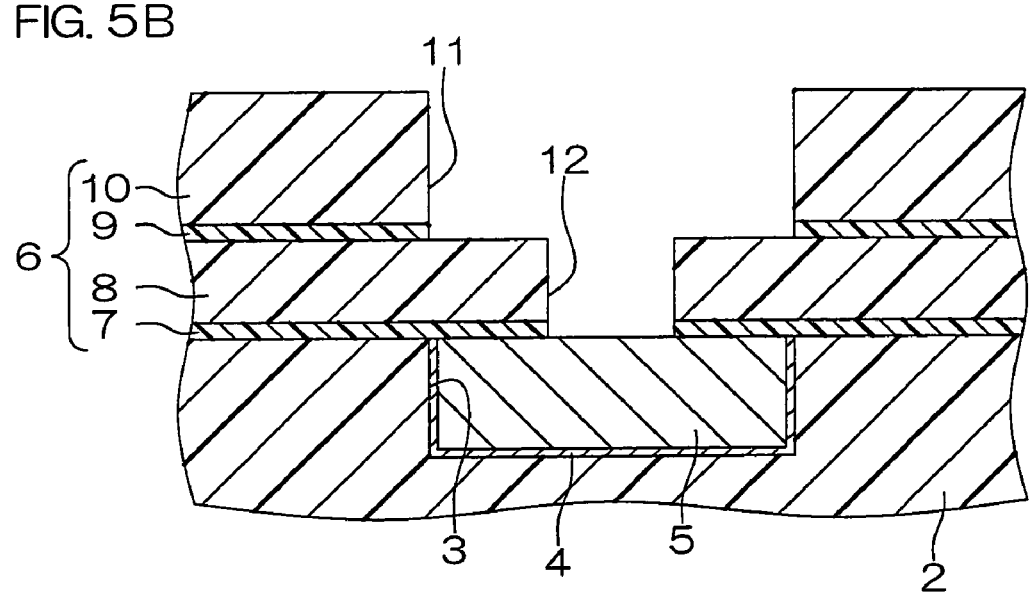

Thereafter the second groove 11 and the via hole 12 are formed in the second insulating layer 6, as shown in FIG. 5B. More specifically, a mask (not shown) having an opening selectively exposing a portion to be provided with the via hole 12 is first formed on the second insulating layer 6. Then, portions (portions facing the opening) of the insulating film 10, the etching stopper film 9 and the interlayer dielectric film 8 exposed from the mask are successively removed by dry etching. At this time, the insulating film 10, the etching stopper film 9 and the interlayer dielectric film 8 are continuously etched by switching reaction gas (etchant) at proper timing. Thereafter the mask is removed from the second insulating layer 6. Then, another mask (not shown) having an opening selectively exposing a portion to be provided with the second groove 11 is formed on the second insulating layer 6. Then, a portion (a portion facing the opening) of the insulating film 10 exposed from the mask is removed by dry etching. Thereafter the mask is removed from the second insulating layer 6. Then, exposed portions of the diffusion preventing film 7 and the etching stopper film 9 are removed. Thus, the second groove 11 and the via hole 12 are formed.

Then, the inner surfaces of the second groove 11 and the via hole 12 and the overall upper surface of the second insulating layer 6 (the insulating film 10) are covered with an alloy film 51 made of a CuMn alloy by sputtering, as shown in FIG. 5C.

Thereafter a seed film 52 made of a metallic material mainly composed of Cu is formed by sputtering to cover the overall surface of the alloy film 51, as shown in FIG. 5D.

Figure 5E:
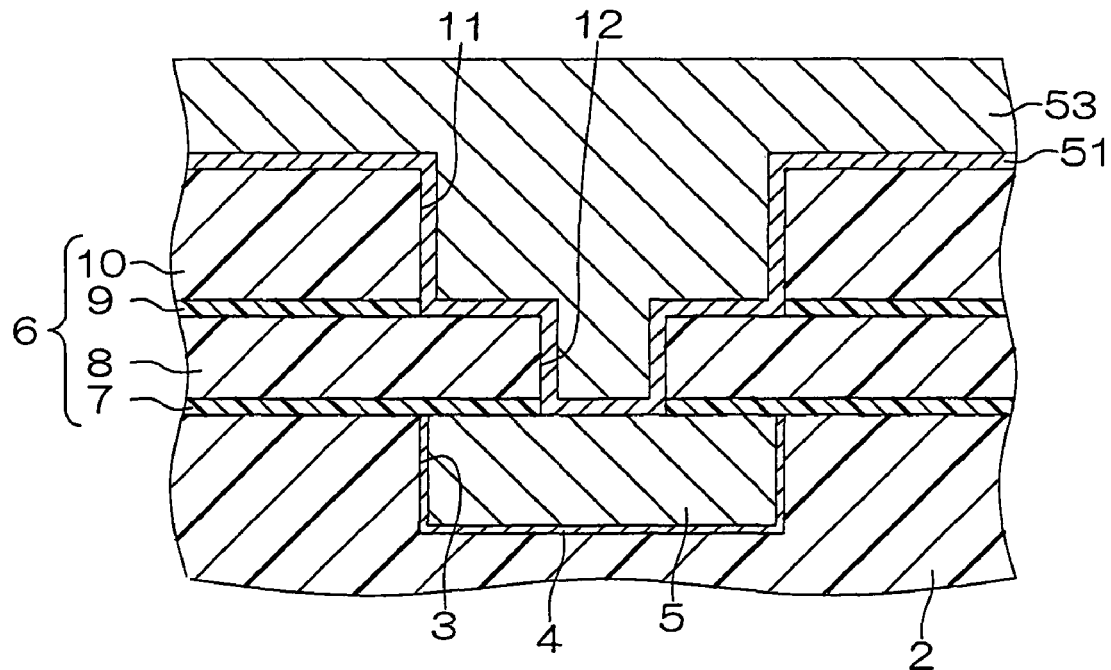

Then, a Cu layer 53 made of a metallic material mainly composed of Cu is stacked on the seed film 52 by plating, as shown in FIG. 5E. The Cu layer 53 is formed with a thickness for filling up the second groove 11 and the via hole 12.

Figure 5F:
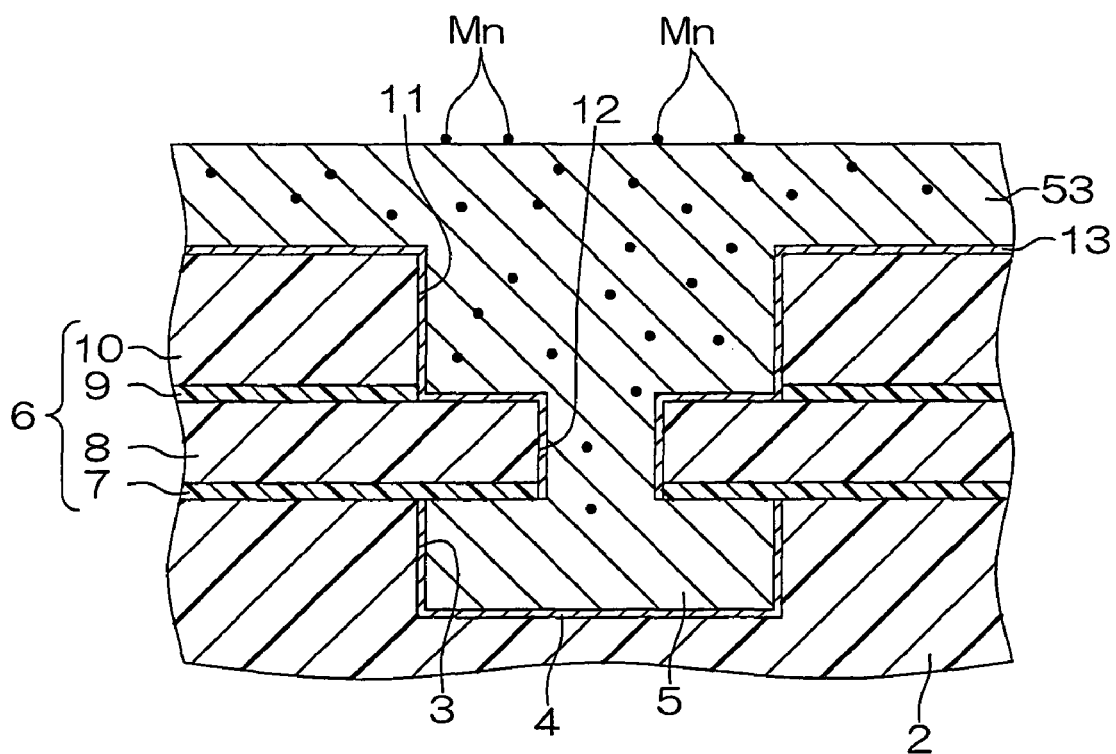

Thereafter heat treatment is performed. High heat is applied to the second insulating layer 6 and the alloy film 51, whereby Si and O contained in the second insulating layer 6 and Mn contained in the alloy film 51 react with (are bonded to) one another on the interface between the second insulating layer 6 and the alloy film 51. Consequently, the second barrier film 13 made of MnSiO is formed between the second insulating layer 6 and the Cu layer 53, as shown in FIG. 5F. At this time, excess Mn not contributing to the formation of the second barrier film 13 diffuses into the Cu layer 53, and partially appears on the surface of the Cu layer 53. Further, the crystal structure of the Cu layer 53 is homogenized and the specific resistance of the Cu layer 53 (the second Cu wire 14) is reduced due to the heat treatment. The alloy film 51 disappears following the formation of the second barrier film 13.

Figure 5G:
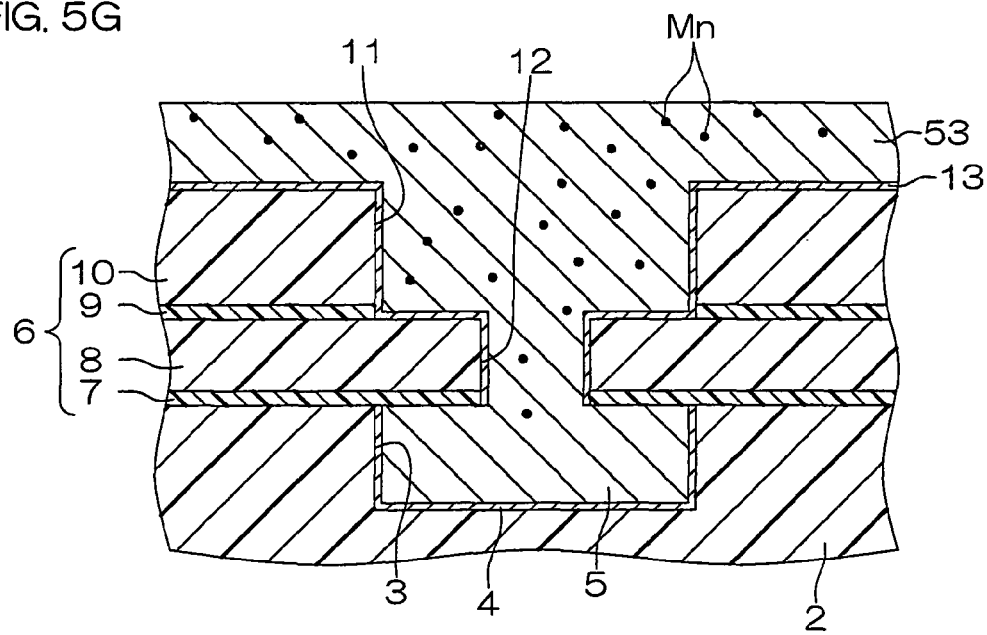

After the formation of the second barrier film 13, the surface of the Cu layer 53 is polished by CMP. Mn is removed from the surface of the Cu layer 53 along with the surface layer portion of the Cu layer 53 by the polishing, as shown in FIG. 5G.

Figure 5H:
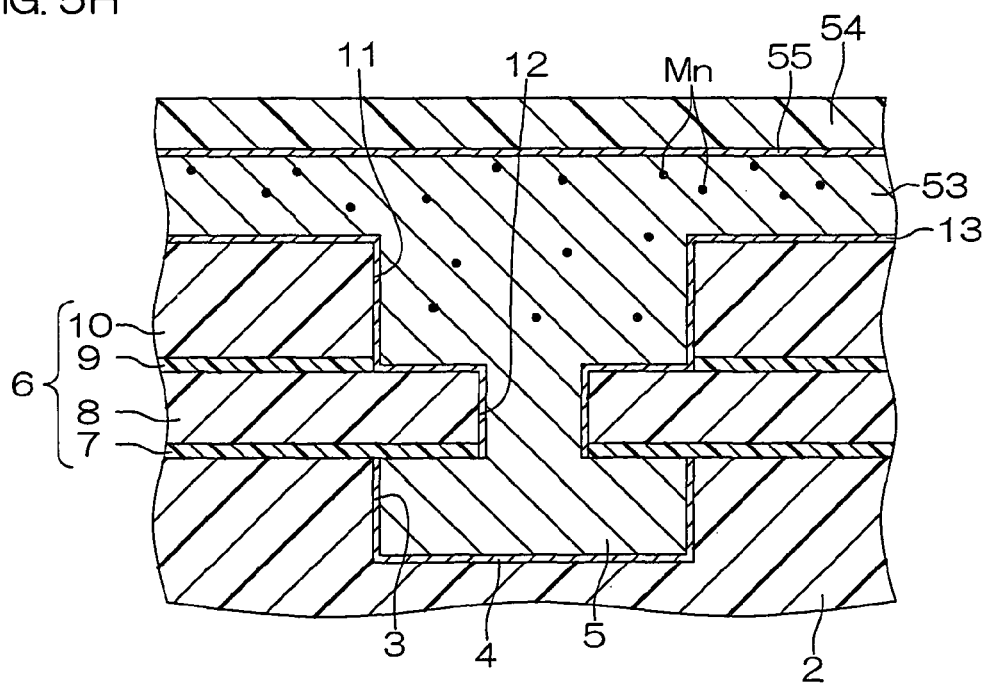
Figure 5:
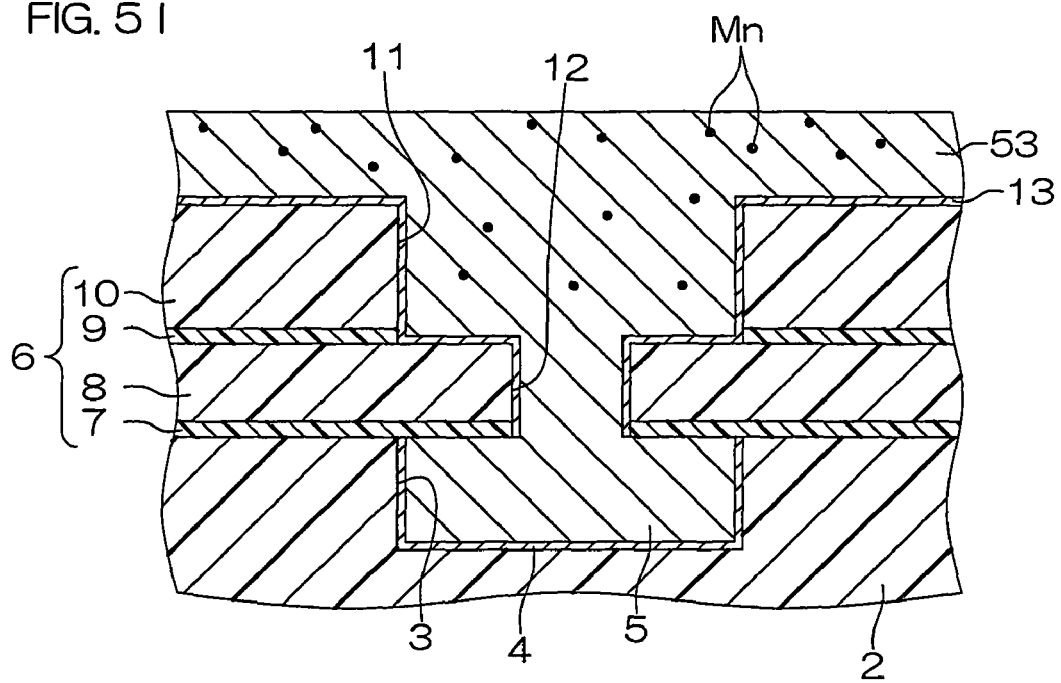
Figure 5:
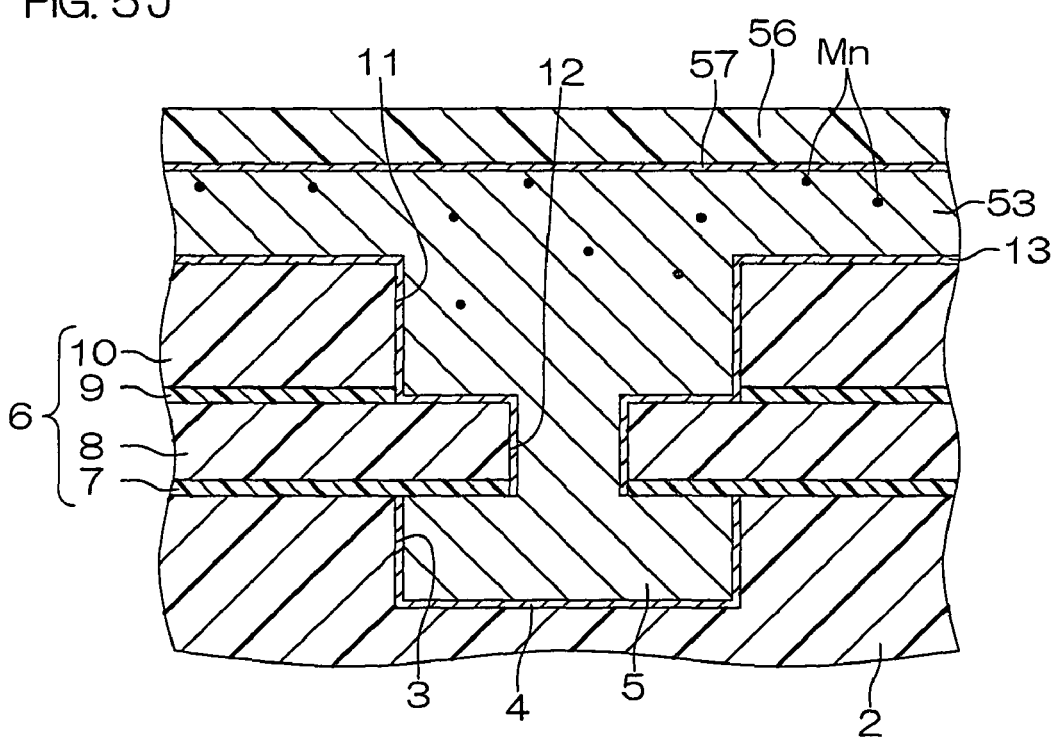

Then, a sacrificial layer 54 made of SiO$_2$ which is an insulating material containing Si and O is stacked on the Cu layer 53 by PECVD (Plasma Enhanced Chemical Vapor Deposition) employing gas containing SiH$_4$, as shown in FIG. 5H. In other words, the sacrificial layer 54 consisting of a silane-based silicon oxide film is stacked on the Cu layer 53. In the process of the stacking of the sacrificial layer 54, a high temperature (about 400° C.) is applied to the Cu layer 53 and the sacrificial layer 54 stacked thereon, whereby Si and O contained in the sacrificial layer 54 and Mn contained in the Cu layer 53 are bonded to one another on the interface between the Cu layer 53 and the sacrificial layer 54, to form a reaction product film 55 made of MnSiO. Mn is used for the formation of the reaction product film 55, whereby the quantity of Mn contained in the Cu layer 53 is reduced. The sacrificial layer 54 may be formed with a thickness (100 nm, for example) necessary and sufficient for forming the reaction product film 55.

Thereafter the sacrificial layer 54 and the reaction product film 55 are removed by CMP, as shown in FIG. 5I.

As shown in FIG. 5J, a sacrificial layer 56 made of the same material as that for the sacrificial layer 54 is stacked on the Cu layer 53 exposed by the removal of the sacrificial layer 54 and the reaction product film 55. In other words, the sacrificial layer 56 made of SiO$_2$ is stacked by PECVD employing gas containing SiH$_4$. In the process of the stacking of the sacrificial layer 56, a high temperature (about 400° C.) is applied to the Cu layer 53 and the sacrificial layer 56 stacked thereon, whereby Si and O contained in the sacrificial layer 56 and Mn contained in the Cu layer 53 are bonded to one another, to form a reaction product film 57 made of MnSiO. Mn is used for the formation of the reaction product film 57, whereby the quantity of Mn contained in the Cu layer 53 is further reduced. The sacrificial layer 56 may be formed with a thickness (100 nm, for example) necessary and sufficient for forming the reaction product film 57.

Thereafter the sacrificial layer 56 and the reaction product film 57 are removed by CMP. Then, the Cu layer 53 and the second barrier film 13 are polished by CMP. The polishing is continued until unnecessary portions of the Cu layer 53 and the second barrier film 13 formed outside the second groove 11 are entirely removed, the upper surface of the second insulating layer 6 (the insulating film 10) is exposed, and the upper surface of the second insulating layer 6 and that of the Cu layer 53 are flush with each other. Thus, the second Cu wire 14 embedded in the second groove 11 is formed, and the semiconductor device 1 shown in FIG. 1 is obtained.

As hereinabove described, the sacrificial layer 54 made of the insulating material containing Si and O is stacked on the Cu layer 53 by PECVD employing gas containing SiH$_4$. The sacrificial layer 54 contains Si and O, whereby the reaction product film 55 made of MnSiO is formed on the interface between the Cu layer 53 and the sacrificial layer 54 in the process of the stacking of the sacrificial layer 54. Mn is used for the formation of the reaction product film 55, whereby the quantity of Mn contained in the Cu layer 53 is reduced. Thus, the quantity of Mn remaining in the second Cu wire 14 consisting of the Cu layer 53 can be reduced.

After the removal of the sacrificial layer 54 and the reaction product film 55, the sacrificial layer 56 is stacked on the Cu layer 53 by PECVD employing the gas containing SiH$_4$, and the reaction product film 57 made of MnSiO is formed on the interface between the Cu layer 53 and the sacrificial layer 56. Thus, the quantity of Mn contained in the Cu layer 53 is further reduced. Therefore, the quantity of Mn remaining in the second Cu wire 14 consisting of the Cu layer 53 can be further reduced.

According to PECVD, high heat is applied to the Cu layer 53 and the sacrificial layers 54 and 56 in the process of the stacking, and the reaction product films 55 and 57 are spontaneously formed. Therefore, no heat treatment (heat treatment after the stacking of the sacrificial layers 54 and 56) is required for forming the reaction product films 55 and 56. Thus, the manufacturing steps for the semiconductor device 1 can be simplified as compared with a case of forming the sacrificial layers 54 and 56 by a method other than PECVD.

The sacrificial layers 54 and 56 can also be formed by PECVD employing TEOS. According to PECVD employing TEOS, however, O$_2$ gas is employed and the Cu layer 53 etc. are exposed to an O$_2$ gas atmosphere of a high temperature (about 400° C.), and hence Cu contained in the Cu layer 53 is easily oxidized. According to PECVD employing the gas containing SiH$_4$, on the other hand, not the O$_2$ gas but N$_2$O gas is employed, whereby Cu is harder to oxidize as compared with the PECVD employing TEOS.

The sacrificial layers 54 and 56 and the reaction product films 55 and 57 are removed by CMP. Thus, the sacrificial layers 54 and 56 and the reaction product films 55 and 57 can be removed through single steps respectively. According to CMP employing a slurry for removing a Ta film, the sacrificial layer 54 and the reaction product film 55 can be excellently removed, and the Cu layer 53 and the second insulating layer 6 can be removed at generally identical polishing rates continuously to the removal of the sacrificial layer 54 and the reaction product film 55. Consequently, the second Cu wire 14 can be obtained with a surface excellent in planarity.

Further, the surface of the Cu layer 53 is polished by CMP after the formation of the second barrier film 13 and before the stacking of the sacrificial layer 54. In the formation of the second barrier film 13, Mn contained in the alloy film 51 partially moves in the Cu layer 53, and appears on the surface of the Cu layer 53. When the surface of the Cu layer 53 is polished by CMP to remove Mn appearing on the surface of the Cu layer 53 and the sacrificial layer 54 is thereafter stacked on the Cu layer 53, Mn remaining in the Cu layer 53 is positively used for the reaction with Si and O. Consequently, the quantity of Mn contained in the Cu layer 53 can be efficiently reduced, and the quantity of Mn remaining in the second Cu wire 14 can be further reduced.

If the quantity of Mn remaining in the Cu layer 53 can be sufficiently reduced by the stacking of the sacrificial layer 54 and the formation of the reaction product film 55, the stacking of the sacrificial layer 56 and the formation of the reaction product film 57 may be omitted.

After the formation of the reaction product film 57, the sacrificial layer 56 and the reaction product film 57 may be removed and a sacrificial layer made of an insulating material containing Si and O may be formed on the Cu layer 53, so that a reaction product film made of MnSiO is formed on the interface between the sacrificial layer and the Cu layer 53. In other words, the steps of forming the reaction product film (stacking the sacrificial layer) and removing the sacrificial layer and the reaction product film may be repeated in this order not less than three times after the formation of the second barrier film 13. When the steps are repeated a plurality of times, the quantity of Mn contained in the Cu layer 53 is reduced as the steps are repeated. Therefore, the quantity of Mn remaining in the second Cu wire 14 can be reliably reduced.

FIGS. 6A to 6H are schematic sectional views showing the steps of manufacturing the semiconductor device by a method according to a fifth embodiment of the present invention.

Figure 6A:
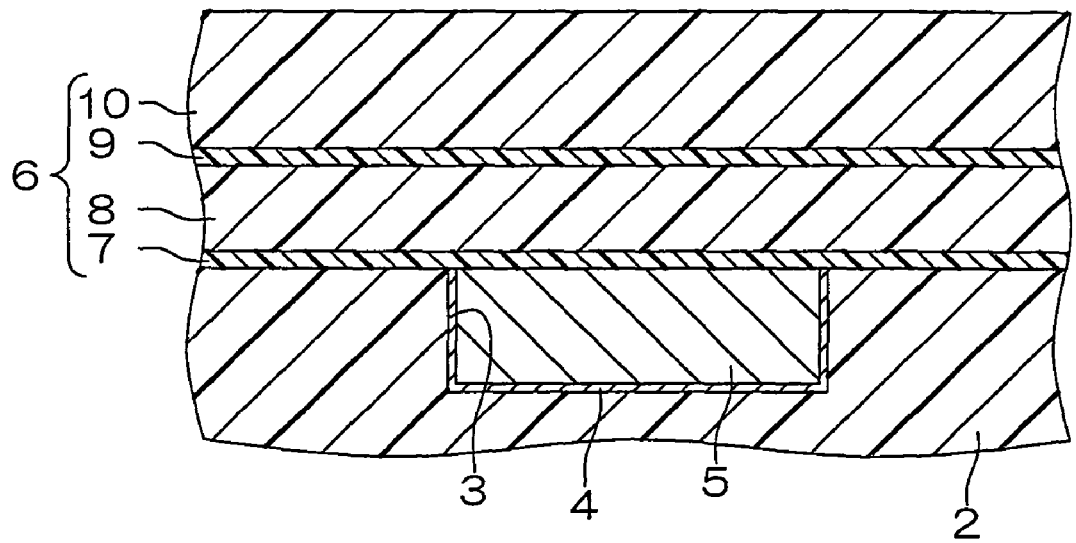
FIGS. 6A to 6H are schematic sectional views showing the steps of manufacturing a semiconductor device by a method according to a fifth embodiment of the present invention.

As shown in FIG. 6A, the diffusion preventing film 7, the interlayer dielectric film 8, the etching stopper film 9 and the insulating film 10 are stacked in this order by CVD on the first insulating layer 2 having the first barrier film 4 and the first Cu wire 5 embedded therein. Thus, the second insulating layer 6 is formed on the first insulating layer 2.

Figure 6B:
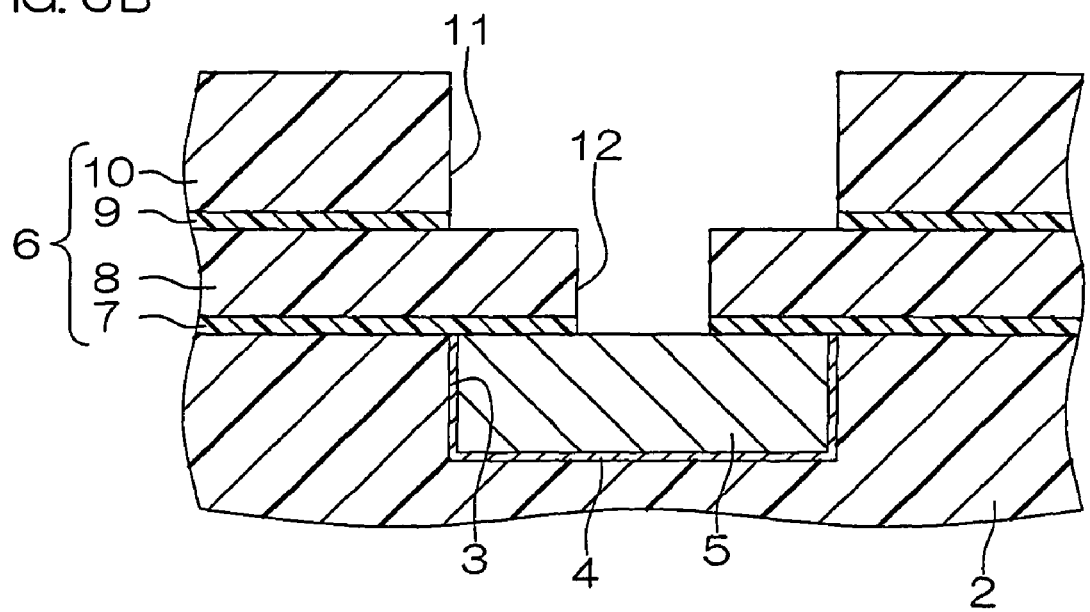

Thereafter the second groove 11 and the via hole 12 are formed in the second insulating layer 6, as shown in FIG. 6B. More specifically, a mask (not shown) having an opening selectively exposing a portion to be provided with the via hole 12 is first formed on the second insulating layer 6. Then, portions (portions facing the opening) of the insulating film 10, the etching stopper film 9 and the interlayer dielectric film 8 exposed from the mask are successively removed by dry etching. At this time, the insulating film 10, the etching stopper film 9 and the interlayer dielectric film 8 are continuously etched by switching reaction gas (etchant) at proper timing. Thereafter the mask is removed from the second insulating layer 6. Then, another mask (not shown) having an opening selectively exposing a portion to be provided with the second groove 11 is formed on the second insulating layer 6. Then, a portion (a portion facing the opening) of the insulating film 10 exposed from the mask is removed by dry etching. Thereafter the mask is removed from the second insulating layer 6. Then, exposed portions of the diffusion preventing film 7 and the etching stopper film 9 are removed. Thus, the second groove 11 and the via hole 12 are formed.

Figure 6C:
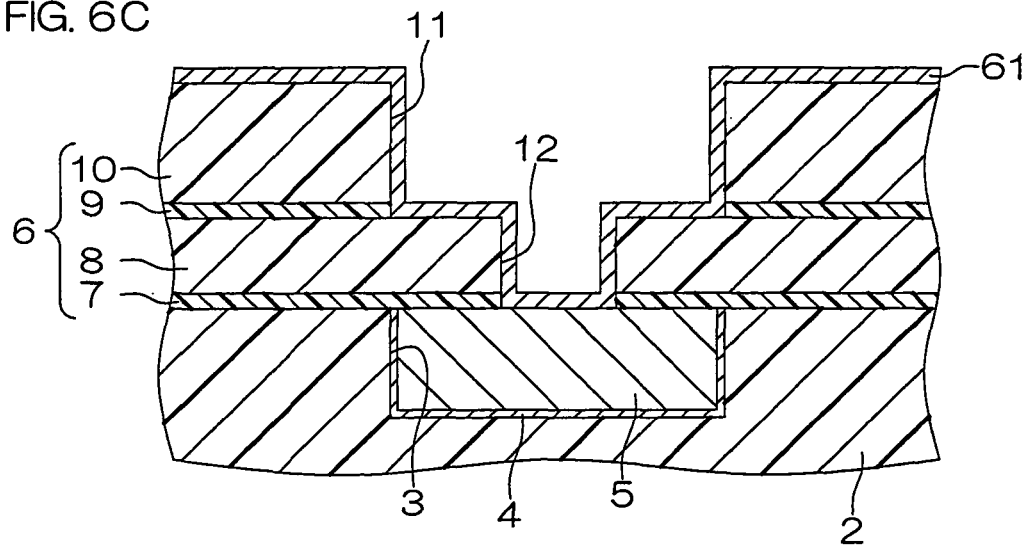

Then, the inner surfaces of the second groove 11 and the via hole 12 and the overall upper surface of the second insulating layer 6 (the insulating film 10) are covered with an alloy film 61 made of a CuMn alloy by sputtering, as shown in FIG. 6C.

Figure 6D:
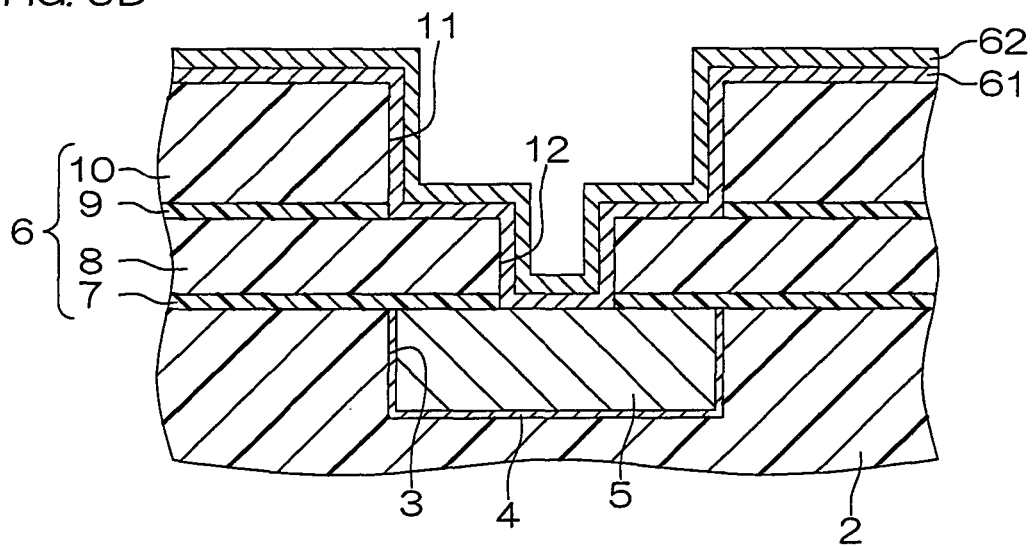

Thereafter a seed film 62 made of a metallic material mainly composed of Cu is formed by sputtering to cover the overall surface of the alloy film 61, as shown in FIG. 6D.

Figure 6E:
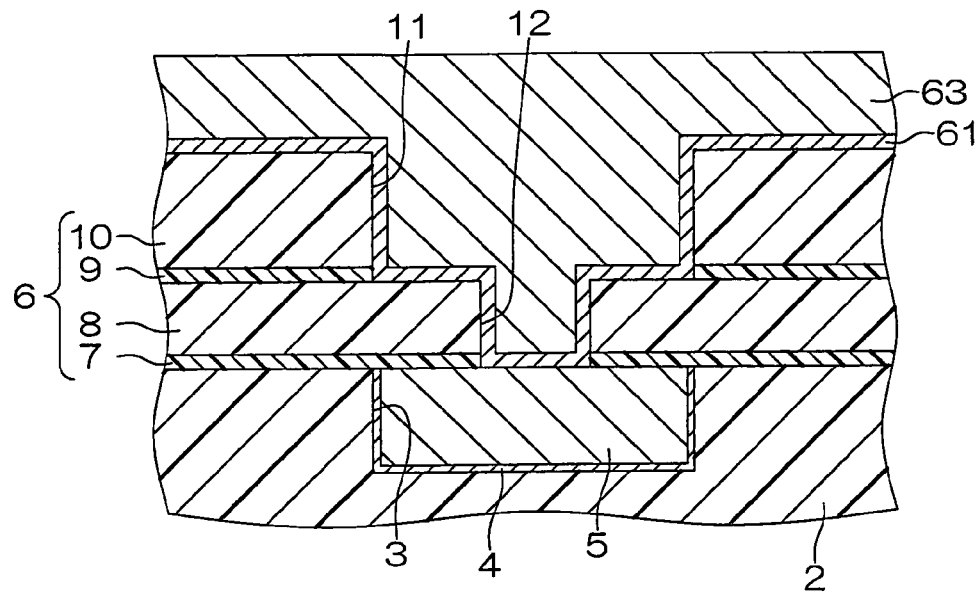

Then, a Cu layer 63 made of a metallic material mainly composed of Cu is stacked on the seed film 62 by plating, as shown in FIG. 6E. The Cu layer 63 is formed with a thickness for filling up the second groove 11 and the via hole 12.

Figure 6F:
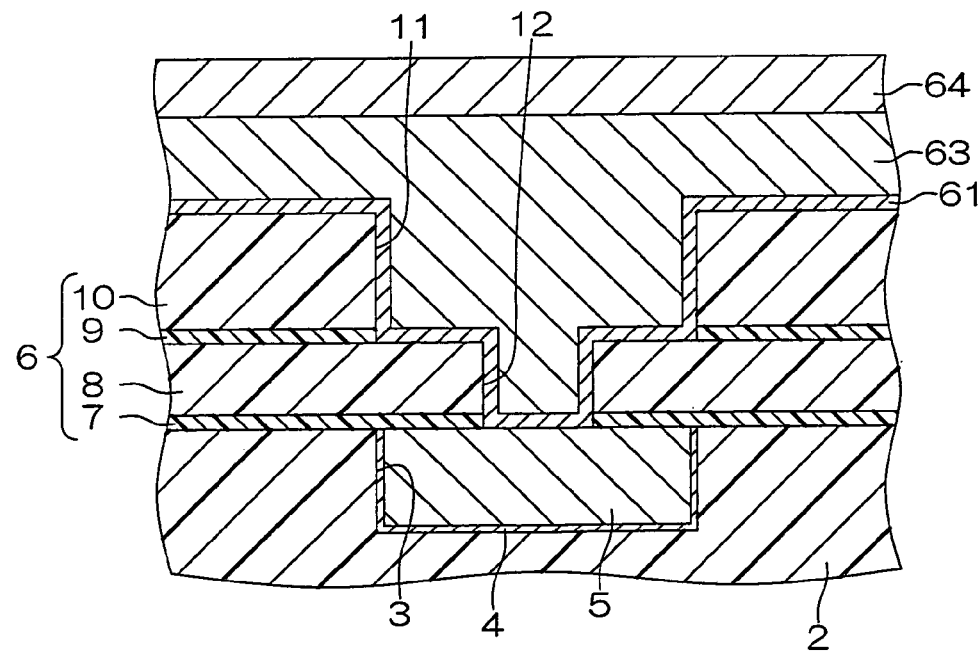

After the stacking of the Cu layer 63, a sacrificial layer 64 made of high-purity Cu (Cu having purity of not less than 99.995%, preferably not less than 99.9999%) is staked on the Cu layer 63 by sputtering, as shown in FIG. 6F.

Figure 6G:
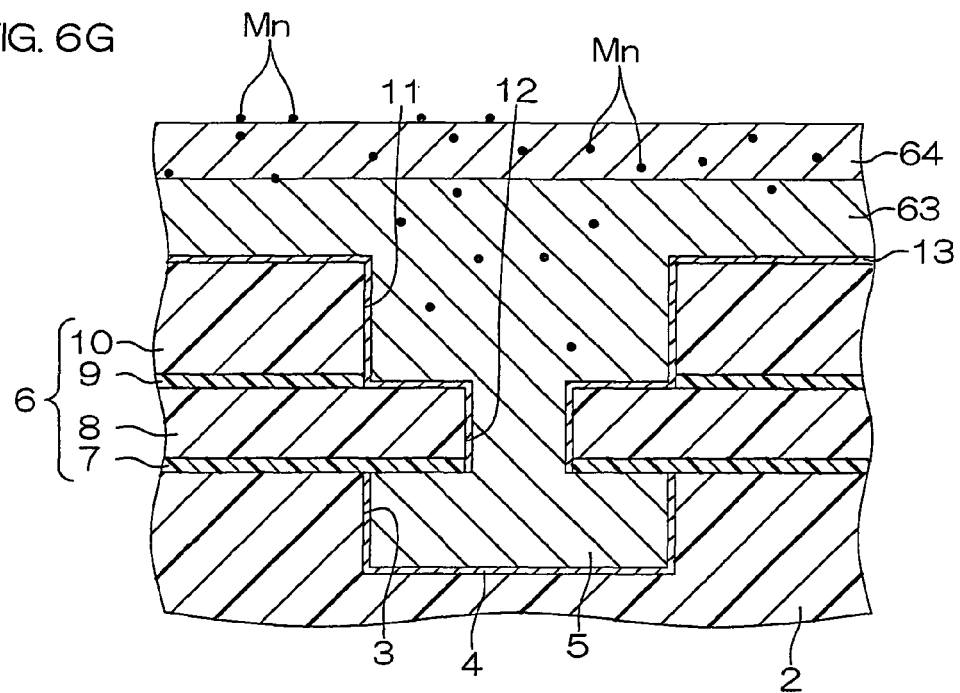

Thereafter heat treatment is performed. High heat is applied to the second insulating layer 6 and the alloy film 61, whereby Si and O contained in the second insulating layer 6 and Mn contained in the alloy film 61 are bonded to one another on the interface between the second insulating layer 6 and the alloy film 61. Consequently, the second barrier film 13 made of MnSiO is formed between the second insulating layer 6 and the Cu layer 63, as shown in FIG. 6G. Further, the crystal structure of the Cu layer 63 is homogenized and the specific resistance of the Cu layer 63 (the second Cu wire 14) is reduced due to the heat treatment. The alloy film 61 disappears following the formation of the second barrier film 13.

In the heat treatment, excess Mn not contributing to the formation of the second barrier film 13 diffuses into the Cu layer 63. The sacrificial layer 64 made of high-purity Cu is stacked on the Cu layer 63, whereby Mn diffusing into the Cu layer 63 partially moves in the Cu layer 63 to be attracted to the sacrificial layer 64, and diffuses into the sacrificial layer 64. Mn diffusing into the sacrificial layer 64 partially appears on the surface of the sacrificial layer 64.

Figure 6H:
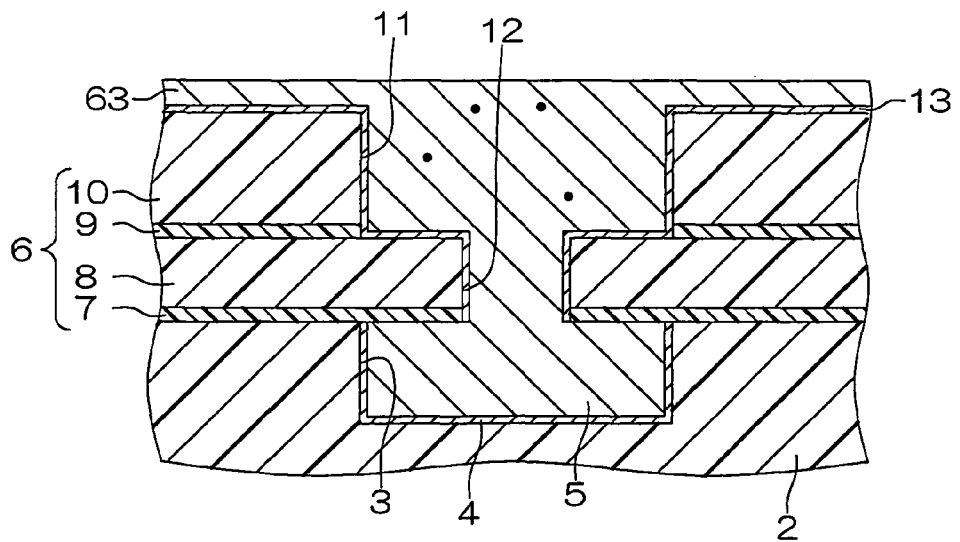

After the heat treatment, the sacrificial layer 64 is removed from the Cu layer 63 by CMP, as shown in FIG. 6H. Then, the Cu layer 63 and the second barrier film 13 are polished by CMP. The polishing is continued until unnecessary portions of the Cu layer 63 and the second barrier film 13 formed outside the second groove 11 are entirely removed, the upper surface of the second insulating layer 6 (the insulating film 10) is exposed, and the upper surface of the second insulating layer 6 and that of the Cu layer 63 are flush with each other. Thus, the second Cu wire 14 embedded in the second groove 11 is formed, and the semiconductor device 1 shown in FIG. 1 is obtained.

As hereinabove described, the sacrificial layer 64 made of high-purity Cu is stacked on the Cu layer 63 after the formation of the Cu layer 63. After the formation of the sacrificial layer 64, the second barrier film 13 made of MnSiO is formed between the Cu layer 63 and the second insulating layer 6 by the heat treatment. At this time, excess Mn not contributing to the formation of the second barrier film 13 diffuses into the Cu layer 63. The sacrificial layer 64 made of high-purity Cu is stacked on the Cu layer 63, whereby Mn diffusing into the Cu layer 63 partially moves in the Cu layer 63 to be attracted to the sacrificial layer 64, and diffuses into the sacrificial layer 64. The quantity of Mn contained in the Cu layer 63 is reduced due to the diffusion of Mn into the sacrificial layer 64. Therefore, the quantity of Mn remaining in the second Cu layer 14 consisting of the Cu layer 63 can be reduced.

FIGS. 7A to 7G are schematic sectional views showing the steps of manufacturing the semiconductor device by a method according to a sixth embodiment of the present invention.

The steps shown in FIGS. 7A to 7G are carried out after the steps shown in FIGS. 6A to 6E, in place of the steps shown in FIGS. 6F to 6H.

Figure 7A:
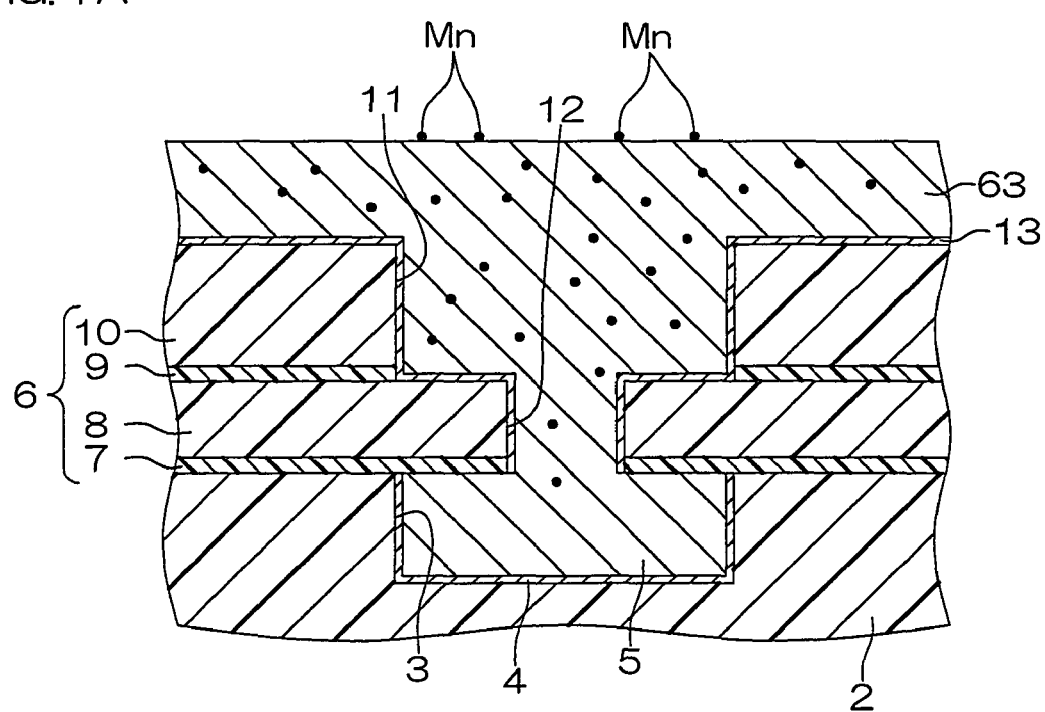

After the Cu layer 63 is stacked in the step shown in FIG. 6E, heat treatment is performed. High heat is applied to the second insulating layer 6 and the alloy film 61, whereby Si and O contained in the second insulating layer 6 and Mn contained in the alloy film 61 are bonded to one another on the interface between the second insulating layer 6 and the alloy film 61. Consequently, the second barrier film 13 made of MnSiO is formed between the second insulating layer 6 and the Cu layer 63, as shown in FIG. 7A. At this time, excess Mn not contributing to the formation of the second barrier film 13 moves in the Cu layer 63, and partially appears on the surface of the Cu layer 63. Further, the crystal structure of the Cu layer 63 is homogenized and the specific resistance of the Cu layer 63 (the second Cu wire 14) is reduced due to the heat treatment. The alloy film 61 disappears following the formation of the second barrier film 13.

Figure 7B:
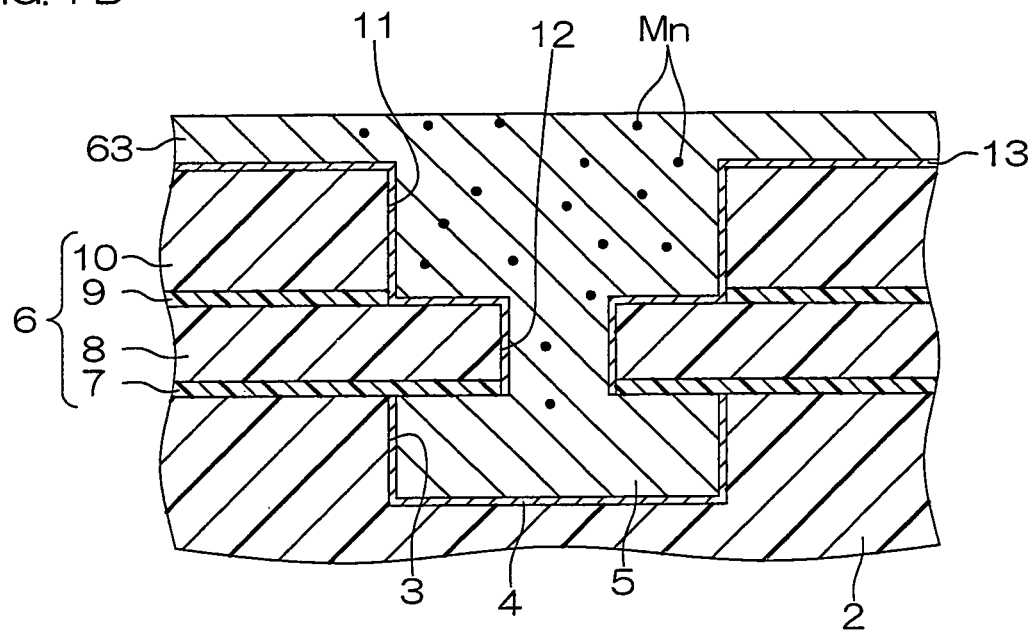

After the heat treatment, the surface of the Cu layer 63 is polished by CMP. Mn contained in the surface layer portion of the Cu layer 63 and that appearing on the surface of the Cu layer 63 are removed along with the surface layer portion of the Cu layer 63 due to the polishing, as shown in FIG. 7B.

Figure 7C:
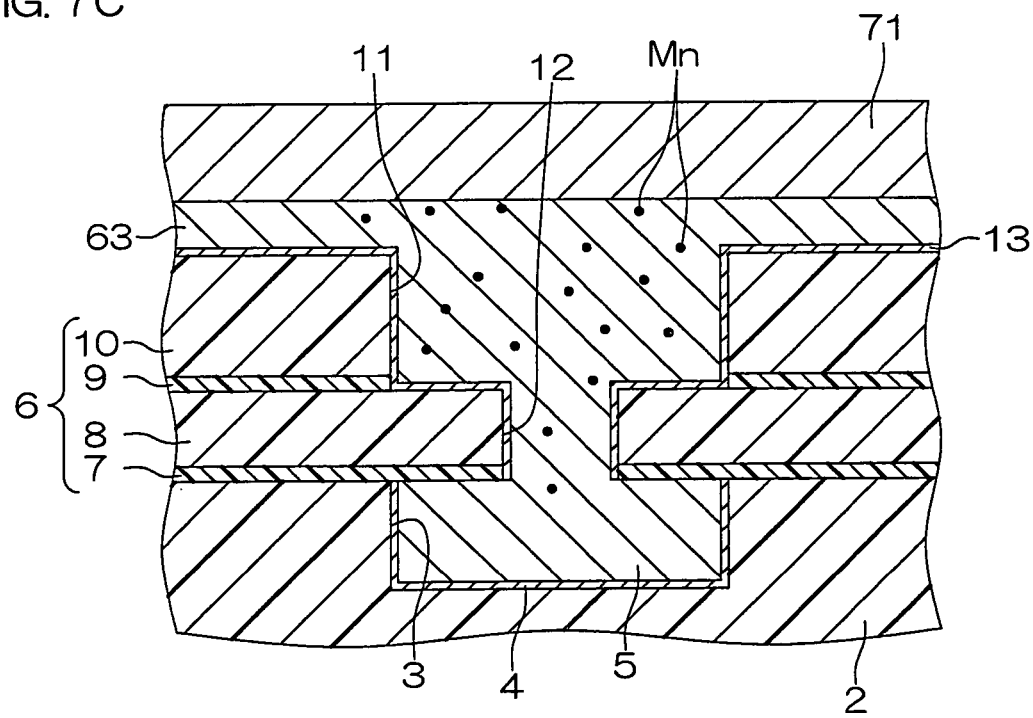

Then, a sacrificial layer 71 made of high-purity Cu is stacked on the Cu layer 63 by sputtering, as shown in FIG. 7C.

Thereafter heat treatment is performed. Mn contained in the Cu layer 63 partially moves in the Cu layer 63 to be attracted to the sacrificial layer 71 and diffuses into the sacrificial layer 71 due to the heat treatment, as shown in FIG. 7D. Mn diffusing into the sacrificial layer 71 partially appears on the surface of the sacrificial layer 71.

Figure 7E:
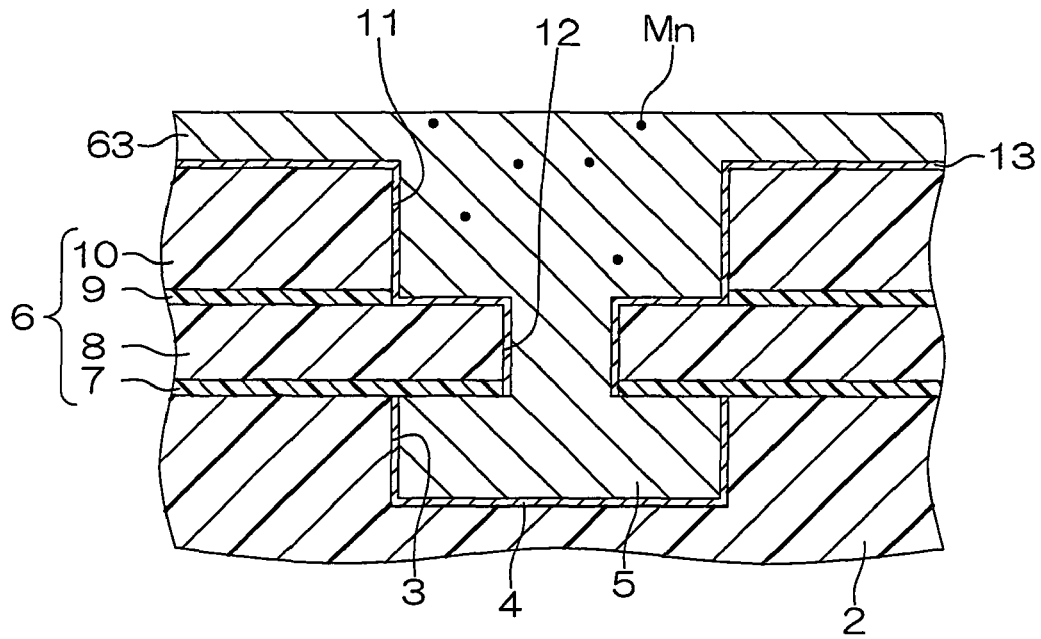

After the heat treatment, the sacrificial layer 71 is removed from the Cu layer 63 by CMP, as shown in FIG. 7E. Thus, Mn diffusing into the sacrificial layer 71 is removed along with the sacrificial layer 71.

Figure 7F:
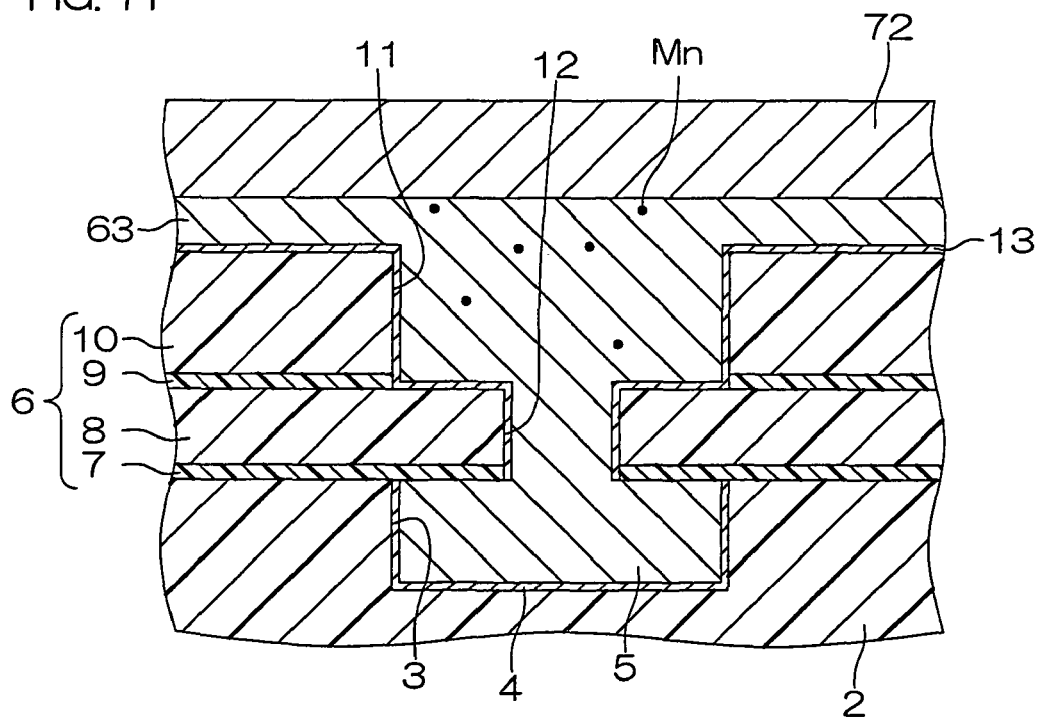

Then, a sacrificial layer 72 made of high-purity Cu is stacked on the Cu layer 63 by sputtering, as shown in FIG. 7F.

Figure 7G:
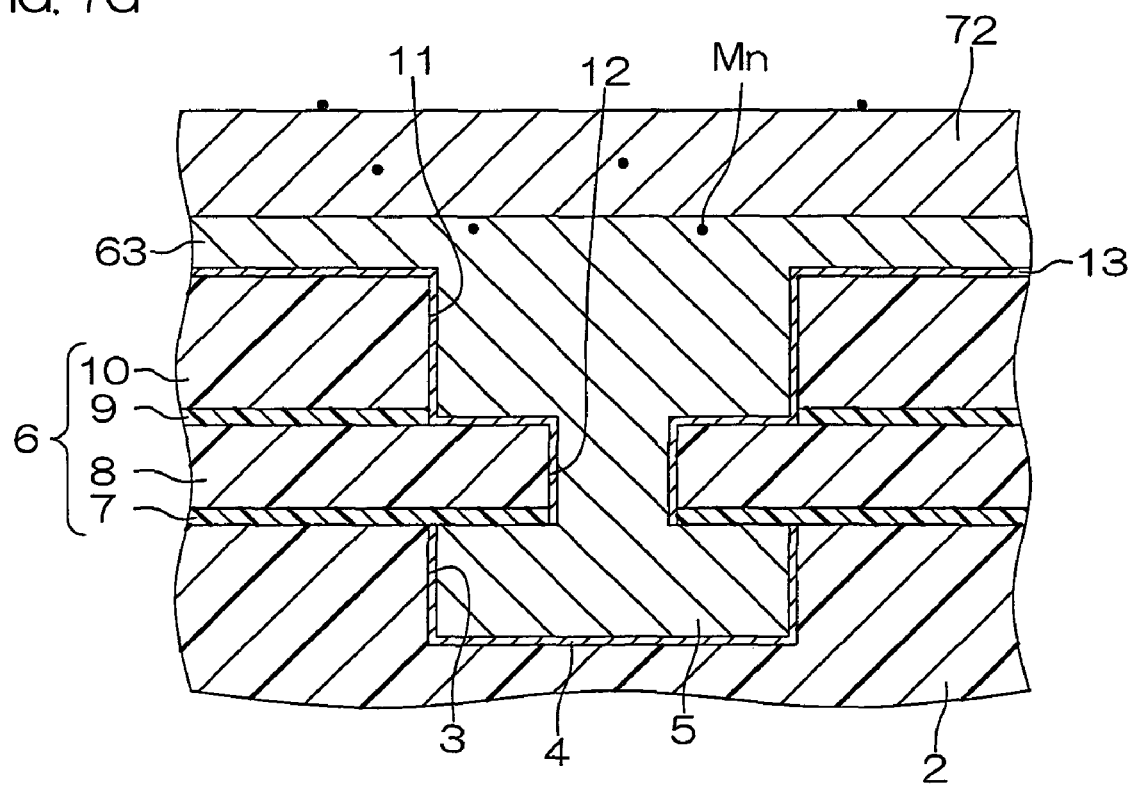

Thereafter heat treatment is reperformed. Mn still remaining in the Cu layer 63 partially moves in the Cu layer 63 to be attracted to the sacrificial layer 72 and diffuses into the sacrificial layer 72 due to the heat treatment, as shown in FIG. 7G. Mn diffusing into the sacrificial layer 72 partially appears on the surface of the sacrificial layer 72.

After the heat treatment, the sacrificial layer 72 is removed from the Cu layer 63. Then, the Cu layer 63 and the second barrier film 13 are polished by CMP. The polishing is continued until unnecessary portions of the Cu layer 63 and the second barrier film 13 formed outside the second groove 11 are entirely removed, the upper surface of the second insulating layer 6 (the insulating film 10) is exposed, and the upper surface of the second insulating layer 6 and that of the Cu layer 63 are flush with each other. Thus, the second Cu wire 14 embedded in the second groove 11 is formed, and the semiconductor device 1 shown in FIG. 1 is obtained.

According to the method, the heat treatment is performed after the stacking of the Cu layer 63. The second barrier film 13 made of MnSiO is formed between the second insulating layer 6 and the Cu layer 63 due to the heat treatment. After the heat treatment, the surface layer portion of the Cu layer 63 is removed. Thereafter the sacrificial layer 71 made of high-purity Cu is formed on the Cu layer 63, and the heat treatment is reperformed.

Excess Mn not contributing to the formation of the second barrier film 13 diffuses into the Cu layer 63 due to the heat treatment after the stacking of the Cu layer 63. Mn diffusing into the Cu layer 63 partially appears on the surface of the Cu layer 63. The surface layer portion of the Cu layer 63 is removed after the heat treatment, whereby Mn reaching the surface portion of the Cu layer 63 and that appearing on the surface of the Cu layer 63 are removed along with the surface layer portion of the Cu layer 63. When the sacrificial layer 71 is stacked after the surface layer portion of the Cu layer 63 is removed and the heat treatment is reperformed, Mn remaining in the Cu layer 63 diffuses into the sacrificial layer 71. The quantity of Mn contained in the Cu layer 63 is reduced due to the diffusion of Mn into the sacrificial layer 71. Therefore, the quantity of Mn remaining in the second Cu wire 14 consisting of the Cu layer 63 can be reduced.

After the removal of the sacrificial layer 71, the sacrificial layer 72 made of high-purity Cu is formed on the Cu layer 63, and the heat treatment is further reperformed. Mn remaining in the Cu layer 63 diffuses into the sacrificial layer 72 due to the heat treatment. The quantity of Mn contained in the Cu layer 63 is further reduced due to the diffusion of Mn into the sacrificial layer 72. Thus, the quantity of Mn remaining in the second Cu wire 14 consisting of the Cu layer 63 can be further reduced.

The material for the sacrificial layers 71 and 72 is not restricted to the high-purity Cu, but may be prepared from Cu having lower purity than the high-purity Cu. If the sacrificial layers 71 and 72 are made of the high-purity Cu, however, Mn remaining in the Cu layer 63 can excellently diffuse into the sacrificial layers 71 and 72. Consequently, the quantity of Mn contained in the Cu layer 63 can be effectively reduced, and the quantity of Mn remaining in the second Cu wire 14 can be further reduced.

If the quantity of Mn remaining in the Cu layer 63 can be sufficiently reduced by the stacking of the sacrificial layer 71, the heat treatment and the removal of the sacrificial layer 71, the stacking of the sacrificial layer 72, the heat treatment and the removal of the sacrificial layer 72 may be omitted.

After the removal of the sacrificial layer 72, stacking of a sacrificial layer made of a metallic material mainly composed of Cu, heat treatment and removal of the sacrificial layer may be additionally performed. In other words, the steps of stacking the sacrificial layer, performing the heat treatment and removing the sacrificial layer may be repeated in this order not less than three times after the removal of the surface layer portion of the Cu layer 63. When the steps are repeated a plurality of times, the quantity of Mn contained in the Cu layer 63 is reduced as the steps are repeated. Therefore, the quantity of Mn remaining in the second Cu wire 14 can be reliably reduced.

While a method of forming the first barrier film 4 and the first Cu wire 5 has not been described, the first barrier film 4 and the first Cu wire 5 can be formed by a method similar to that for forming the second barrier film 13 and the second Cu wire 14.

In a first method, for example, the first groove 3 in the form of the recess dug from the surface of the first insulating layer 2 is formed in the first insulating layer 2 by photolithography and etching, and an alloy film made of a MnO is formed on the side surfaces and the bottom surface of the first groove 3 by sputtering. At this time, Si and O in the first insulating layer 2 and MnO in the metal film are bonded to one another due to the energy of the sputtering, whereby the first barrier film 4 made of MnSiO is formed on the side surfaces and the bottom surface of the first groove 3. Then, a seed film and a Cu layer both made of a metallic material mainly composed of Cu are successively formed by plating. Then, unnecessary portions (portions formed outside the first groove 3) of the plating layer are removed by CMP. Thus, the first barrier film 4 and the first wire 5 are obtained in the first groove 3.

In a second method, the first groove 3 in the form of the recess dug from the surface of the first insulating layer 2 is formed in the first insulating layer 2 by photolithography and etching, and a metal film made of a Mn is formed on the side surfaces and the bottom surface of the first groove 3 by sputtering. Then, heat treatment is performed, whereby the first barrier film 4 made of MnSiO is formed on the side surfaces and the bottom surface of the first groove 3. Then, a seed film and a Cu layer both made of a metallic material mainly composed of Cu are successively formed by plating. Then, unnecessary portions (portions formed outside the first groove 3) of the plating layer are removed by CMP. Thus, the first barrier film 4 and the first wire 5 are obtained in the first groove 3.

In a third method, the first groove 3 in the form of the recess dug from the surface of the first insulating layer 2 is formed in the first insulating layer 2 by photolithography and etching, and an alloy film made of a CuMn alloy is formed on the side surfaces and the bottom surface of the first groove 3 by sputtering. Then, a seed film and a Cu layer both made of a metallic material mainly composed of Cu are successively formed by plating. Then, a sacrificial layer made of an insulating material containing Si and O is stacked on the Cu layer and a reaction product film made of MnSiO on the interface between the sacrificial layer and the Cu layer. After removal of the sacrificial layer and the reaction product film, the Cu layer and the first barrier film 4 are removed from portions formed outside the first groove 3 so that the surface of the Cu layer is flush with the surface of the insulating layer located outside the first groove 3, for example, whereby the first Cu wire 5 embedded in the first groove 3 through the first barrier film 4 is obtained.

In a forth method, the first groove 3 in the form of the recess dug from the surface of the first insulating layer 2 is formed in the first insulating layer 2 by photolithography and etching, and an alloy film made of a CuMn alloy is formed on the side surfaces and the bottom surface of the first groove 3 by sputtering. Then, a seed film and a Cu layer both made of a metallic material mainly composed of Cu are successively formed by plating. Then, a sacrificial layer made of high-purity Cu is stacked on the Cu layer. After the formation of the sacrificial layer, heat treatment is performed. After the heat treatment, the sacrificial layer is removed from the Cu layer. After the removal of the sacrificial layer, the Cu layer and the first barrier film 4 are removed from portions formed outside the first groove 3 so that the surface of the Cu layer is flush with the surface of the insulating layer located outside the first groove 3, for example, whereby the first Cu wire 5 embedded in the first groove 3 through the first barrier film 4 is obtained.

The material for the interlayer dielectric film 8 and the insulating film 10 may simply be an insulating material containing Si and O, and SiOC (carbon-doped silicon oxide) or SiOF (fluorine-doped silicon oxide) can be employed as the material for the interlayer dielectric film 8 and the insulating film 10, in place of $SiO_2$.

While the present invention is applied to the method of manufacturing the semiconductor device having the first Cu wire 5 and the second Cu wire 14 made of the metallic material mainly composed of Cu, the present invention is also applicable to a method of manufacturing a capacitor having an electrode made of a metallic material mainly composed of Cu in an insulating layer containing Si and O.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-202138 filed with the Japan Patent Office on Aug. 5, 2008, Japanese Patent Application No. 2008-214626 filed with the Japan Patent Office on Aug. 22, 2008, Japanese Patent Application No. 2008-236649 filed with the Japan Patent Office on Sep. 16, 2008 and Japanese Patent Application No. 2008-245864 filed with the Japan Patent Office on Sep. 25, 2008, the disclosures of these applications are incorporated herein by reference.

What is claimed is:

1. A method of manufacturing a semiconductor device, comprising:
   a groove forming step of forming a groove in an insulating layer made of an insulating material containing Si and O;
   a metal film applying step of covering the inner surface of the groove with a metal film made of $MnO_x$ (x: a number greater than zero) or Mn;
   a barrier film forming step of forming a barrier film made of $Mn_xSi_yO_z$ (x, y and z: numbers greater than zero) on the inner surface of the groove; and
   a wire forming step of forming a Cu wire made of a metallic material mainly composed of Cu on the metal film, wherein
   the metal film made of $MnO_x$ is formed by sputtering in the metal film applying step,
   the barrier film forming step is the same as the metal film applying step,
   a lower wire electrically connected with the Cu wire is formed under the insulating layer,
   the method further comprises:
   a via hole forming step of forming a via hole extending from the groove toward the lower wire and passing through the insulating layer in the thickness direction after the groove forming step and before the metal film applying step; and
   a via forming step of forming a via made of a metallic material mainly composed of Cu in the via hole after the metal film applying step,
   the side surface of the via hole and a portion of the surface of the lower wire facing the via hole are also covered with the metal film in the metal film applying step, in addition to the inner surface of the groove, and
   the method further comprises a step of removing O from a portion of the metal film in contact with the surface of the lower wire by hydrogen reduction in advance of the via forming step.

2. The method of manufacturing a semiconductor device according to claim 1, wherein
   the wire forming step includes the steps of:
   forming a seed film made of a metallic material mainly composed of Cu on the metal film by sputtering, and
   forming a plating layer made of Cu on the seed film by plating.

3. The method of manufacturing a semiconductor device according to claim 2, wherein
   the wire forming step further includes a crystallizing step of crystallizing the plating layer by heat treatment.

4. A method of manufacturing a semiconductor device, comprising:
   a groove forming step of forming a groove in an insulating layer made of an insulating material containing Si and O;
   a metal film applying step of covering the inner surface of the groove with a metal film made of $MnO_x$ (x: a number greater than zero) or Mn;
   a barrier film forming step of forming a barrier film made of $Mn_xSi_yO_z$ (x, y and z: numbers greater than zero) on the inner surface of the groove;
   a wire forming step of forming a Cu wire made of a metallic material mainly composed of Cu on the metal film; and
   a step of removing O from the metal film by hydrogen reduction in advance of the wire forming step.

5. The method of manufacturing a semiconductor device according to claim 4, wherein
   the metal film made of $MnO_x$ is formed by sputtering in the metal film applying step, and
   the barrier film forming step is the same as the metal film applying step.

6. The method of manufacturing a semiconductor device according to claim 5, wherein
   a lower wire electrically connected with the Cu wire is formed under the insulating layer,
   the method further comprises:
   a via hole forming step of forming a via hole extending from the groove toward the lower wire and passing through the insulating layer in the thickness direction after the groove forming step and before the metal film applying step, and
   a via forming step of forming a via made of a metallic material mainly composed of Cu in the via hole after the metal film applying step, and
   the side surface of the via hole and a portion of the surface of the lower wire facing the via hole are also covered with the metal film in the metal film applying step, in addition to the inner surface of the groove.

7. The method of manufacturing a semiconductor device according to claim 4, wherein
   the wire forming step includes the steps of:
   forming a seed film made of a metallic material mainly composed of Cu on the metal film by sputtering, and
   forming a plating layer made of Cu on the seed film by plating.

8. The method of manufacturing a semiconductor device according to claim 4, wherein
the wire forming step further includes a crystallizing step of crystallizing the plating layer by heat treatment.

9. A method of manufacturing a semiconductor device, comprising:
a groove forming step of forming a groove in an insulating layer made of an insulating material containing Si and O;
a metal film applying step of covering the inner surface of the groove with a metal film made of $MnO_x$ (x: a number greater than zero) or Mn;
a barrier film forming step of forming a barrier film made of $Mn_xSi_yO_z$ (x, y and z: numbers greater than zero) on the inner surface of the groove; and
a wire forming step of forming a Cu wire made of a metallic material mainly composed of Cu on the metal film,
wherein the metal film made of $MnO_x$ is formed by sputtering in the metal film applying step,
the barrier film forming step is the same as the metal film applying step, and a lower wire electrically connected with the Cu wire is formed under the insulating layer,
the method further comprises a via hole forming step of forming a via hole extending from the groove toward the lower wire and passing through the insulating layer in the thickness direction after the groove forming step and before the metal film applying step, and
a via forming step of forming a via made of a metallic material mainly composed of Cu in the via hole after the metal film applying step,
wherein the side surface of the via hole and a portion of the surface of the lower wire facing the via hole are also covered with the metal film in the metal film applying step, in addition to the inner surface of the groove,
the method further comprises a step of disappearing the metal film from the lower wire by MnO to be reduced to Mn so as to Mn diffuses into the via and the like.

10. The method of manufacturing a semiconductor device according to claim 9, wherein
the wire forming step includes the steps of:
forming a seed film made of a metallic material mainly composed of Cu on the metal film by sputtering, and
forming a plating layer made of Cu on the seed film by plating.

11. The method of manufacturing a semiconductor device according to claim 9, wherein
the wire forming step further includes a crystallizing step of crystallizing the plating layer by heat treatment.

* * * * *